United States Patent
Ifuku et al.

(10) Patent No.: US 7,948,154 B2
(45) Date of Patent: May 24, 2011

(54) PIEZOELECTRIC SUBSTANCE, PIEZOELECTRIC ELEMENT, AND LIQUID DISCHARGE HEAD AND LIQUID DISCHARGE APPARATUS USING PIEZOELECTRIC ELEMENT

(75) Inventors: Toshihiro Ifuku, Yokohama (JP); Kenichi Takeda, Yokohama (JP); Tetsuro Fukui, Yokohama (JP); Hiroshi Funakubo, Yokohama (JP)

(73) Assignees: Canon Kabushiki Kaisha, Tokyo (JP); Tokyo Institute of Technology, Tokyo (JP)

( * ) Notice: Subject to any disclaimer, the term of this patent is extended or adjusted under 35 U.S.C. 154(b) by 216 days.

(21) Appl. No.: 12/301,567

(22) PCT Filed: Jul. 13, 2007

(86) PCT No.: PCT/JP2007/064384
§ 371 (c)(1),
(2), (4) Date: Nov. 19, 2008

(87) PCT Pub. No.: WO2008/010583
PCT Pub. Date: Jan. 24, 2008

(65) Prior Publication Data
US 2009/0273257 A1    Nov. 5, 2009

(30) Foreign Application Priority Data
Jul. 18, 2006 (JP) ................... 2006-196114

(51) Int. Cl.
*H01L 41/187* (2006.01)

(52) U.S. Cl. ..................... 310/358
(58) Field of Classification Search ............ 310/358
See application file for complete search history.

(56) References Cited

U.S. PATENT DOCUMENTS

| | | |
|---|---|---|
| 5,804,907 A | 9/1998 | Park et al. |
| 6,198,208 B1 | 3/2001 | Yano et al. |
| 6,517,737 B2 | 2/2003 | Cheong et al. |
| 7,120,978 B2 | 10/2006 | Wasa et al. |
| 7,144,101 B2 | 12/2006 | Ifuku et al. |
| 7,279,825 B2 | 10/2007 | Ifuku et al. |
| 7,309,950 B1 | 12/2007 | Aoki et al. |
| 7,521,845 B2 | 4/2009 | Ifuku et al. |
| 2007/0046153 A1 | 3/2007 | Matsuda et al. |
| 2007/0046734 A1 | 3/2007 | Aoki et al. |

(Continued)

FOREIGN PATENT DOCUMENTS
JP          8-116103         5/1996
(Continued)

OTHER PUBLICATIONS
International Preliminary Report on Patentability in PCT Application No. PCT/JP2007/064384 dated Jan. 29, 2009.

(Continued)

*Primary Examiner* — Thomas M Dougherty
(74) *Attorney, Agent, or Firm* — Fitzpatrick, Cella, Harper & Scinto

(57) ABSTRACT

A piezoelectric substance which is made of oxide with perovskite type structure which is made of $ABO_3$, where a principal component of A is Pb, and principal components of B contain at least two kinds of elements among Nb, Mg, Zn, Sc, Cd, Ni, Mn, Co, Yb, In, and Fe, and Ti, characterized by being a uniaxial orientation crystal or a single crystal which has an a-domain and a c-domain of tetragonal.

36 Claims, 14 Drawing Sheets

U.S. PATENT DOCUMENTS

| | | |
|---|---|---|
| 2007/0048190 A1 | 3/2007 | Ifuku et al. |
| 2007/0060467 A1 | 3/2007 | Matsuda et al. |
| 2007/0090728 A1 | 4/2007 | Matsuda et al. |
| 2007/0215715 A1 | 9/2007 | Fukui et al. |
| 2008/0012054 A1 | 1/2008 | Ifuku et al. |
| 2008/0012908 A1 | 1/2008 | Takeda et al. |
| 2008/0012909 A1 | 1/2008 | Matsuda et al. |
| 2008/0012910 A1 | 1/2008 | Matsuda et al. |
| 2008/0278038 A1* | 11/2008 | Kobayashi et al. ........... 310/358 |

FOREIGN PATENT DOCUMENTS

| | | | |
|---|---|---|---|
| JP | 2000-332569 | | 11/2000 |
| JP | 2001-80995 | | 3/2001 |
| JP | 2002-356370 | | 12/2002 |
| JP | 3397538 | | 2/2003 |
| JP | 2004-249729 | * | 9/2004 |
| JP | 2008-4781 A | * | 1/2008 |

OTHER PUBLICATIONS

Satoshi Wada, et al., "Enhanced Piezoelectric Property of Lead-free Piezoelectric Single Crystals by Domain Engineering," Ceramics, vol. 40 (8), 2005, pp. 598-603 (with partial translation).

S.K. Singh, et al. "Crystalline Properties of Ferroelectric—Relaxor PMN-PT Thin Films by Pulsed Laser Deposition," Applications of Ferroelectrics, 2002, pp. 133-136.

J.G. Smits, et al., "The Constituent Equations of Piezoelectric Heterogeneous Bimorphs", IEEE Transactions on Ultrasonics, Ferroelectrics and Frequency Control, vol. 38, No. 3, 1991, pp. 256-270.

* cited by examiner

PIEZOELECTRIC SUBSTANCE, PIEZOELECTRIC ELEMENT, AND LIQUID DISCHARGE HEAD AND LIQUID DISCHARGE APPARATUS USING PIEZOELECTRIC ELEMENT

TECHNICAL FIELD

The present invention relates to a piezoelectric substance, a piezoelectric element, and a liquid discharge head and liquid discharge apparatus using the piezoelectric element.

BACKGROUND ART

In recent years, a piezo-electric actuator attracts attention in a portable information device field, and chemistry and medical fields as a new motor, which replaces an electromagnetic motor, in that miniaturization and high densification of a motor are allowed. The piezoelectric actuator does not generate an electromagnetic noise on the occasion of its drive, and, is not influenced by noise. Furthermore, the piezoelectric actuator attracts attention as a part of making such equipment with submillimeter class size that is represented by a micromachine, and a minute piezoelectric thin-film element is requested as its drive source.

As for a piezoelectric material used for a piezoelectric element, generally, it is common to obtain by finely forming a sintered compact or a single crystal member as a bulk material, which is given heat-treatment so as to obtain characteristics as a piezoelectric substance, in desired size and thickness with technology such as machining and polishing. In addition, when forming a minute piezoelectric thin-film element, a method of directly forming the piezoelectric thin-film element by coating and calcining a green sheet-like piezoelectric substance by using methods, such as a printing method, in a predetermined position on a substrate, such as metal or silicon is common. A thickness of such a compact from a green sheet is tens to hundreds of μm, electrodes are provided in upper and lower sides of the piezoelectric substance, and a voltage is applied through the electrodes.

Heretofore, a small piezoelectric element which was used for a liquid discharge head was produced by finely forming a piezoelectric substance as a bulk material with technology such as machining or polishing as mentioned above, or using a green sheet-like piezoelectric substance. As a device using such a piezoelectric thin-film element, for example, there is a liquid discharge head which has unimorph type piezoelectric thin-film element structure. The liquid discharge head is equipped with a pressure chamber communicating with an ink feed chamber, and an ink discharge orifice communicating with the pressure chamber, and a diaphragm with which the piezoelectric element is bonded or in which it is formed directly is provided and composed in the pressure chamber. In such construction, an ink droplet is discharged from the ink discharge port by compressing the ink in the pressure chamber by generating flexural vibration, which is caused by expanding and contracting the piezoelectric element by applying a predetermined voltage to the piezoelectric element.

Although color ink jet printers have spread presently by using such an operation of the above-mentioned piezoelectric substance, enhancement in their printing performance, and in particular, higher resolution, and high speed printing are requested. Therefore, it has been attempted to attain high resolution and high speed printing using multi-nozzle head structure in which a liquid discharge head has been miniaturized. In order to miniaturize a liquid discharge head, it is necessary to miniaturize further a piezoelectric element for discharging ink.

Furthermore, recently, attempts of applying liquid discharge heads to industrial applications such as straight writing of wiring have been also active. At that time, it is necessary to pattern liquid with more various characteristics on a processed surface at higher resolution, and hence, further high performance of a liquid discharge head is requested.

In recent years, because of development of micromachine technology, researches of developing a highly precise micro piezoelectric element by forming a piezoelectric substance as a thin film, and using fine processing technology having been used in semiconductors have been performed. In particular, a thickness of a piezoelectric film formed by film methods, such as a sputtering method, a chemical vapor deposition method, a sol gel method, a gas deposition method, and a pulsed laser deposition method is generally hundreds of nm to tens of μm in the case of an application to a piezoelectric actuator. Electrodes are provided to this piezoelectric film and a voltage is applied through these electrodes.

On the other hand, researches of high performance piezoelectric materials, having larger piezoelectric property, in connection with miniaturization of a piezoelectric element are also active. Generally, when an electric field is applied in a direction of intrinsic polarization of a monocrystalline piezoelectric substance, it is considered that high piezoelectric characteristics are obtained, but researches of performing domain control called domain engineering as one method of enhancement in piezoelectricity of a piezoelectric substance have been performed recently. For example, as a relaxer monocrystalline piezoelectric substance, $\{Pb(Zn_{1/3}Nb_{2/3})O_3\}_{1-x}$—$(PbTiO_3)_x$ (lead zinc niobate-lead titanate: PZN-PT) is known. In this relaxer monocrystalline piezoelectric substance, drastic improvement of a piezoelectric constant by performing domain control is reported. That is, in "Ceramics Vol. 40, (8), 2005, P. 600 (reference 1: Non-Patent Document 1), it is reported that the piezoelectric constant of 30 times or more (2500-2800 pC/N) of a piezoelectric constant $d_{33}$ in a spontaneous polarization direction is obtained in this material.

In addition, a relaxer-based monocrystalline piezoelectric substance that is represented by, for example, $\{Pb(Mg_{1/3}Nb_{2/3})O_3\}_{1-x}$—$(PbTiO_3)$, (lead magnesium niobate-lead titanate: PMN-PT) shows excellent piezoelectricity in particular. In U.S. Pat. No. 5,804,907 specification (Patent Document 1), it is described that large piezoelectricity is obtained when an electric field is applied in a <001> direction of a PMN-PT monocrystalline piezoelectric substance. This piezoelectricity is achieved by adjusting composition to a pueudo cubic side near a morphotropic phase boundary (MPB) between a tetragonal and a pueudo cubic of PMN-PT which is generally said for piezoelectricity to be good, and applying a voltage to the <100> direction. This is illustrated in a phase diagram of FIG. 2b in the patent.

These are considered that a relaxer single crystal material expresses large piezoelectricity by using phase transformation (rhombohedral, pueudo cubic ->tetragonal) of the reversible crystal following an application of an electric field by domain engineering generally called engineered domain structure.

Nevertheless, generally, such a monocrystalline piezoelectric substance is synthesized by flux melting of PMN-PT as described in Japanese Patent No. 3,397,538 specification (Patent Document 2). Such bulk state of piezoelectric substance needs to be given fine formation by techniques, such as machining and polishing, as described above, and hence, an application to a highly accurate micro piezoelectric element is hard.

Then, forming such a piezoelectric substance as a film using film methods, such as sputtering method, a chemical vapor deposition method, a sol gel method, a gas deposition method, and a pulsed laser deposition method, has been investigated. In the following documents, it is reported that a PMN-PT thin film was formed as a film by the PLD method.
—Applications of Ferroelectrics, 2002, ISAF 2002, proceedings of the 13th IEEE International Symposium P133-136 (Non-Patent Document 2). Nevertheless, even if it is the above-mentioned piezoelectric highly piezoelectric material, when a piezoelectric film is formed by a thin film forming method using it, such high piezoelectricity that is originally expected has not been achieved yet.

On the other hand, as represented by $Pb(Zr_xTi_{1-x})O_3$ (lead zirconate titanate: PZT), Japanese Patent Application Laid-Open No. H08-116103 (Patent Document 3) describes a method of controlling crystal orientation to a monocrystalline (001) when a material which shows excellent ferroelectricity, pyroelectricity, and piezoelectricity is formed by a thin film forming method. Japanese Patent Application Laid-Open No. 2000-332569 (Patent Document 4) and U.S. Pat. No. 6,198,208 specification (Patent Document 5) propose a method of using 90-degree domains where orientation (100) and orientation (001) of tetragonal structure are intermingled. Nevertheless, since a MPB region with good characteristics cannot be used in the above-mentioned method, such high piezoelectricity that is originally expected has not been achieved yet.

DISCLOSURE OF THE INVENTION

As described above, it is a large task at the time of performing effective application of a piezoelectric substance to confirm optimal material, crystal structure, orientation, and the like as a piezoelectric substance film. Then, an object of the present invention is to provide a piezoelectric substance and a piezoelectric element which solve the above-mentioned issues, and have large piezoelectricity. Another object of the present invention is to provide a piezoelectric substance suitable to a liquid discharge head which shows uniform and high discharging performance, and can perform patterning of a liquid with more various characteristics in further higher resolution on a processed surface. Further another object of the present invention is to provide a liquid discharge head and a liquid discharge apparatus which use this piezoelectric substance.

A piezoelectric substance of the present invention is a piezoelectric substance which is made of oxide with perovskite type structure which is made of $ABO_3$, where a principal component of A is Pb, and principal components of B contain at least two kinds of elements among Nb, Mg, Zn, Sc, Cd, Ni, Mn, Co, Yb, In, and Fe, and Ti, and is characterized by being a uniaxial orientation crystal or a single crystal which has a-domains and c-domains of tetragonal.

The piezoelectric element of the present invention is a piezoelectric element which has a first electrode film, a piezoelectric film, and a second electrode film on a substrate, and is characterized in that the above-mentioned piezoelectric film is formed as a film which has a thickness, which is in a range of 1 μm or more and 10 μm or less, from the above-mentioned piezoelectric substance, and that an electric field can be applied in a thickness direction of the above-mentioned piezoelectric film by the above-mentioned first electrode film and the above-mentioned second electrode film.

A liquid discharge head of the present invention is a liquid discharge head equipped with a discharge port, and a piezoelectric element for discharging a liquid from the discharge port, and is characterized in that the above-mentioned piezoelectric element is a piezoelectric element with the above-mentioned construction.

A liquid discharge apparatus of the present invention is characterized by having a liquid discharge head with the above-mentioned construction.

The piezoelectric substance of the present invention is a piezoelectric substance which is made of oxide which is made of $ABO_3$, where a principal component of A is Pb, and principal components of B contain at least two kinds of elements among Nb, Mg, Zn, Sc, Cd, Ni, Mn, Co, Yb, In, and Fe, and Ti, and is formed as a uniaxial orientation crystal or a single crystal which has a-domains and c-domains of tetragonal. By using this piezoelectric substance, a piezoelectric element using a piezoelectric substance (piezoelectric film) which has large piezoelectricity can be obtained. Furthermore, by using this piezoelectric substance, a liquid discharge head which shows uniform and high discharging performance, and can perform patterning of a liquid with more various characteristics in further higher resolution on a processed surface can be obtained.

BEST MODE FOR CARRYING OUT THE INVENTION

Figure 1:
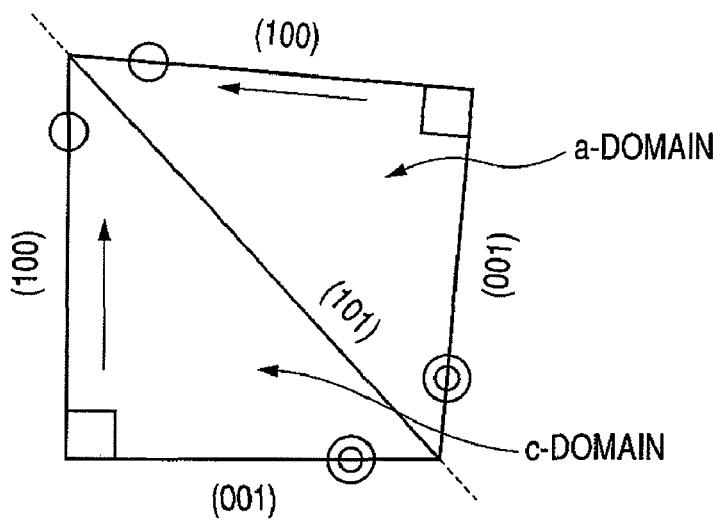
FIG. 1 is a diagram for describing twin crystal structure of a piezoelectric film of the present invention.

A piezoelectric substance according to the present invention is made of oxide with perovskite type structure which is made of $ABO_3$, where a principal component of A is Pb, and principal components of B contain at least two kinds of elements among Nb, Mg, Zn, Sc, Cd, Ni, Mn, Co, Yb, In, and Fe, and Ti, and is characterized by being a uniaxial orientation crystal or a single crystal which has a-domains and c-domains of tetragonal. This piezoelectric substance has formability as a thin film at a film thickness of 1 μm or more and 10 μm or less, and a piezoelectric film obtained can be applied suitably to a liquid discharge head and the like.

The piezoelectric element of the present invention is a piezoelectric thin-film element which includes a first electrode film, a piezoelectric film, and a second electrode film on a substrate, and uses a piezoelectric substance film with the above-mentioned construction as a piezoelectric film. This piezoelectric element can obtain piezoelectric property by applying an electric field in a thickness direction of the piezoelectric film from the first and second electrode films. A liquid discharge head and a liquid discharge apparatus can be produced using this piezoelectric element.

As one of reasons why the piezoelectric substance of the present invention has large piezoelectricity, a possibility of phase transformation of crystals by an applied electric field can be considered. In addition, it is considered as another reason that a domain switch from a-domains to c-domains occurs. Furthermore, since the piezoelectric substance of the present invention is a film which has the a-domains and c-domains, a possibility that the phase transformation of crystals by an applied electric field occurs easily can be considered. By using the domain engineering, piezoelectric displacement larger than polarization displacement which a material originally has can be obtained on the basis of the phase transformation of crystals following the above-mentioned applied electric field, and rotation (switch) of domains (for example, domains which have polarization in an approximately vertical direction) which are not horizontal to the electric field. However, very high energy is necessary so as to express such piezoelectric displacement. Non-Patent Document 1 reports that it is effective to lessen domain size as one direction of enhancing the piezoelectricity by performing domain control. For this reason, in order to lower the energy of the piezoelectric displacement in the piezoelectric substance to which the domain engineering is applied, such domain structure that the phase transformation of crystals and the rotation of domains are induced in the piezoelectric substance is important.

When domain size becomes small, domains can have "minute fluctuation", and hence, the energy of the piezoelectric displacement by the domain engineering is lowered. In particular, in order to apply the domain engineering in a film with many membrane stress and lattice defects to obtain large piezoelectric displacement, it is particularly important to control domains in a state of having such minute fluctuations. Thus, it is considered that a reason why the piezoelectric substance of the present invention has high piezoelectricity is because the phase transformation of crystals following the applied electric field, and the rotation (switch) of domains (for example, domains which have polarization in an approximately vertical direction) which are not horizontal to the electric field occur. In addition, although the piezoelectric substance of the present invention has complicated domain structure, it is considered that the phase transformation and domain switch of crystals can be induced in the piezoelectric substance by existence of these domains, and the energy of the piezoelectric displacement by the domain engineering is lowered for high piezoelectricity to be able to be had.

An embodiment of the present invention will be described below on the basis of drawings.

(Piezoelectric Thin-Film Element)

Figure 7:
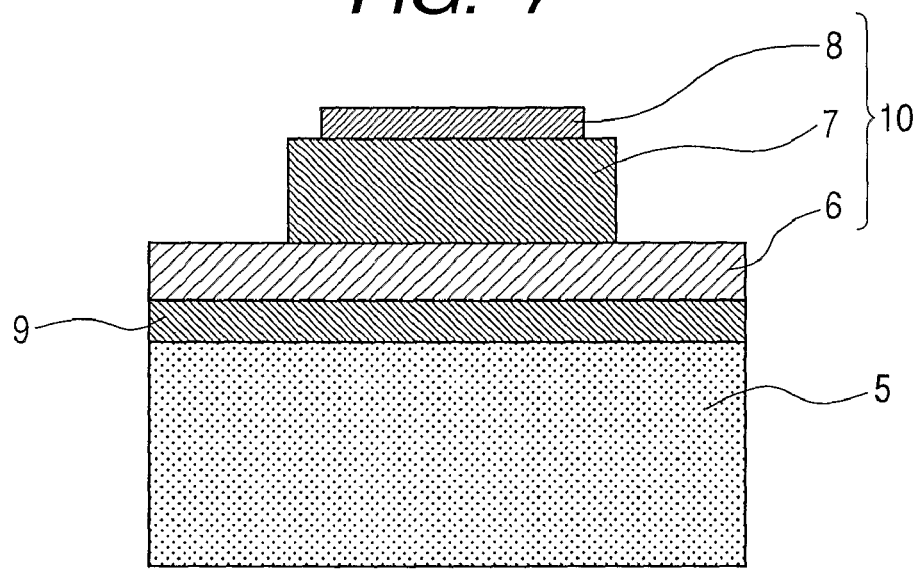
FIG. 7 is a sectional schematic diagram of a piezoelectric thin-film element of the present invention.

A piezoelectric element 10 of the present invention where a piezoelectric thin-film was made into a thin film is a piezoelectric thin-film element which includes a first electrode film, a piezoelectric film, and a second electrode film, and FIG. 7 illustrates details. FIG. 7 is a sectional diagram of the piezoelectric thin-film element. In the figure, reference numeral 6 denotes a first electrode, reference numeral 7 denotes a piezoelectric film, and reference numeral 8 denotes a second electrode. Although a sectional shape of the piezoelectric thin-film element 10 is shown by a rectangle, a trapezoid or an inverted trapezoid may be also sufficient. The illustrated piezoelectric thin-film element 10 is formed on a substrate 5, a first electrode film 6 becomes a bottom electrode, and a second electrode film 8 becomes a top electrode. The top and bottom relation of the electrodes is not limited to this, but construction that the first electrode film 6 becomes a top electrode can be also adopted. This reason is based on a production method at the time of device making, and either can obtain the effect of the present invention. In addition, there may be a buffer layer 9 between the substrate 5 and the bottom electrode film 16.

The piezoelectric thin-film element 10 of the present invention can be produced by forming the first electrode film 6 on the substrate 5 or the buffer layer 9 formed on the substrate 5, next forming a piezoelectric film 7 thereon, and further forming the second electrode film 8.

(Piezoelectric Film)

The piezoelectric film 7 of the present invention is made of oxide with perovskite type structure which is made of a general formula $ABO_3$, where a principal component of A is Pb, and principal components of B contain at least two kinds of elements among Nb, Mg, Zn, Sc, Cd, Ni, Mn, Co, Yb, In, and Fe, and Ti. The following respective oxide materials can be cited as suitable specific examples.

(1) Oxide material which uses as a principal component magnesium acid niobic acid titanic acid expressed in $(Pb_k, \alpha_1)_x(Mg_m, Nb_n, Ti_o, \beta_p)_y O_3$ (where, $1 \leq x/y < 1.5$, $k+l=1$, $0.7 < k \leq 1$, $0 \leq l \leq 0.3$, $m+n+o+p=1$, $0.1 < m < 0.3$, $0.3 < n < 0.5$, $0.2 < o < 0.4$, and $0 \leq p < 0.3$ are fulfilled, α contains any one kind of element selected from among La, Ca, Ba, Sr, Bi, and Sb, and β contains any one kind of element selected from among Pb, Sc, In, Yb, Ni, Ta, Co, W, Fe, and Sn.)

(2) Oxide material which uses as a principal component scandium acid niobic acid titanic acid expressed in $(Pb_k, \alpha_1)_x(Sc_m, Nb_n, Ti_o, \beta_p)_y O_3$ (where, $1 \leq x/y < 1.5$, $k+l=1$, $0.7 \leq k \leq 1$, $0 \leq l \leq 0.3$, $m+n+o+p=1$, $0.1 < m < 0.4$, $0.1 < n < 0.4$, $0.3 < o < 0.5$, and $0 \leq p < 0.3$ are fulfilled, α contains any one kind of element selected from among La, Ca, Ba, Sr, Bi, and Sb, and β contains any one kind of element selected from among Pb, Ta, In, Yb, Mg, Ni, Co, W, Fe, and Sn.)

(3) Oxide material which uses as a principal component zinc acid niobic acid titanic acid expressed in $(Pb_k, \alpha_1)_x(Zn_m, Nb_n, Ti_o, \beta_p)_y O_3$ (where, $1 \leq x/y < 1.5$, $k+l=1$, $0.7 \leq k \leq 1$, $0 \leq l \leq 0.3$, $m+n+o+p=1$, $0.2<m<0.4$, $0.5<n<0.7$, $0.05<o<0.2$, and $0 \leq p<0.3$ are fulfilled, α contains any one kind of element selected from among La, Ca, Ba, Sr, Bi, and Sb, and β contains any one kind of element selected from among Pb, Sc, In, Yb, Ni, Ta, Co, W, Fe, Sn, and Mg.)

In addition, in the piezoelectric film of the present invention, the above-mentioned piezoelectric substance is a uniaxial orientation crystal or a single crystal which has a-domains and c-domains of tetragonal. As for the uniaxial orientation or single crystal in this case, it is particularly suitable that it is <100> orientation. Furthermore, as for the piezoelectric film of the present invention, it is suitable that crystal phases of the piezoelectric substance have tetragonal, and any one of pueudo cubic, rhombohedral, and monoclinic.

As one of reasons why the piezoelectric film of the present invention has large piezoelectricity, a possibility that crystals of pueudo cubic, rhombohedral, and monoclinic crystal perform phase transformation to crystals of tetragonal by an applied electric field in a film thickness direction can be considered. In addition, it is considered as another reason that a domain switch from a-domains to c-domains occurs. Furthermore, since the piezoelectric film of the present invention is a film which has the a-domains and c-domains, a possibility that the phase transformation of crystals by an applied electric field occurs easily can be considered.

Furthermore, in the piezoelectric film of the present invention, it is suitable that at least a part of the a-domains and c-domains have mirror image relation of a twin crystal a (N0N) (N is an integer) plane of which is made a twin plane. This is because it becomes easier for the above-mentioned domain switch to be made expressed when the piezoelectric film has such a twin crystal. In addition, at the same time, it is because it becomes such structure that internal stress generated when the piezoelectric thin-film element is produced is easier to be relieved because the twin plane of the twin crystal is {110}.

The twin crystal which can be used in the present invention means a crystal in which mirror image relation holds true by making into a twin plane a plane on which a crystal which constructs a piezoelectric film exists. As a representative example, a crystal which has the mirror image relation as shown in FIG. 1 is a twin crystal which can be used by the present invention. FIG. 1 is a schematic diagram of crystal structure that a crystal is tetragonal and has an a-domain and a c-domain. This c-domain has a crystal axis of (100) in a direction perpendicular to a thickness direction, that is, [001] in a thickness direction. In addition, the a-domain has a crystal axis of (100) in a direction which has some shift from the thickness direction, that is, [001] in a direction which has some shift from an intra-film direction. The a-domain and the c-domain have a mirror image relation of a twin crystal by making (101) into a twin plane. The some shift in this case has magnitude of an extent of subtracting 90° from two times of an angle which has tangential relation with a-axis length and c-axis length of a crystal lattice of tetragonal. This may change a little with membrane stress and the like. Generally, the above-mentioned some shift generated by a twin crystal is approximately several degrees since a unit lattice of perovskite multiple oxide which is made of the general formula $ABO_3$ is comparatively close to a cube. Here, arrows in FIG. 1 show direction of an [001] axis.

As mentioned above, a twin crystal which has a mirror image relation as shown in FIG. 1 is illustrated as a representative example of the twin crystal of the present invention. Nevertheless, in the piezoelectric film in the present invention, it is suitable that at least a part of the a-domain and c-domain has mirror image relation of a twin crystal a (N0N) (N is an integer) plane of which is made a twin plane, and even if it is a twin crystal other than that in FIG. 1, what is necessary is that the (N0N) plane (N is an integer) is a twin plane. For example, even if a c-domain has (100) in a direction perpendicular to a direction of inclining by about 5° from a thickness direction, the some shift between the a-domain and c-domain may not be magnitude of an extent of subtracting 90° from two times of an angle which has tangential relation with a-axis length and c-axis length of a crystal lattice of tetragonal. Furthermore, the a-domain and c-domain may be made of a plurality of domains further with significant difference on a plurality of structure.

In addition, as for a film thickness of the piezoelectric film of the present invention, it is suitable to be 1 μm to 10 μm (both inclusive). This is because it may be hard in less than 1 μm to intermingle crystal phases of tetragonal which has the above a-domain and c-domain, and any one of pueudo cubic, rhombohedral, and monoclinic. In addition, it may be hard in more than 10 μm to form a piezoelectric film by a thin film method such as sputtering.

Here, the a-domain of uniaxial orientation or single crystal of the present invention which is given <100> orientation is a general term of a domain having a plane (100) within a range of ±10° to a surface of the substrate, that is, a crystal axis of [100] orientation within a range of ±10° to a thickness direction. In addition, the c-domain of uniaxial orientation or single crystal of the present invention which is given <100> orientation is a general term of a domain having a plane (001) within a range of ±10° to the surface of the substrate in the piezoelectric film, that is, a crystal axis of [001] orientation within a range of ±10° to a thickness direction.

Here, the orientation in the present invention means having single crystal orientation in a film thickness direction. For example, <100> orientation is that crystal axes in a thickness direction of the piezoelectric film are aligned in the <100> direction.

The a-domain and c-domain, the crystal phase, and the twin crystal structure can be confirmed by reciprocal lattice mapping method of an X ray analysis. The domain switching at the time of an applied electric field and the phase transformation of a crystal can be confirmed by performing the above-described X-ray diffraction under an applied electric field. The single crystal film and uniaxial orientation film can be confirmed with an X ray analysis θ-2θ method, a rocking curve method, or a pole measuring method of an asymmetric surface. Although crystal structure of a piezoelectric film can be easily confirmed by the X-ray diffraction, besides the above-described X-ray diffraction, for example, it may be confirmed by sectional observation by a transmission electron microscope (TEM), and the like. In addition, a composition ratio of Zr/(Zr+Ti) can be confirmed by composition analysis (ICP composition analysis) by an inductively coupled plasma atomic emission spectrometry apparatus, X-ray fluorescence, and the like.

Here, it can be confirmed using the X-ray diffraction whether a piezoelectric film has orientation. For example, in the case of <100> orientation, as for peaks resulting from the piezoelectric film in a 2θ/θ measurement of the X-ray diffraction, only peaks of {L00} planes (L=1, 2, 3, . . . , n: n is an integer), such as {100} and {200} are detected. In addition, {100} in the present invention is expression of generically naming a total of six planes generally expressed in (100), (010), (001), and the like, and similarly, <100> in the present invention is expression of generically naming a total of six orientations generally expressed in [100], [010], [001], and the like. For example, [100] and [001] are the same when a crystal system is a cubic, but they should be distinguished in the case of tetragonal, or rhombohedral. However, even if being tetragonal, or rhombohedral, a crystals with the perovskite type structure has lattice constants near those of a cubic. Hence, in the present invention, [100] and [001] of tetragonal, and [111] of rhombohedral are generically named in <100> and <111>:

$$[\bar{1}\bar{1}\bar{1}] \quad \text{(Formula 1)}$$

In addition, the following formula is written as "1 bar":

$$\bar{1} \quad \text{(Formula 2)}$$

In the present invention, for example, in tetragonal, even if [001] which is a polarization direction, [100] and [010] which are non-polarization directions exist at the same time, it is <100> orientation with <100> single crystal orientation. In addition, in the present invention, for example, when a plurality of crystal phases, such as tetragonal, rhombohedral, and monoclinic, are intermingled (mixed phase), when crystals resulting from a twin crystal and the like are intermingled, and also when there are a dislocation, a defect, and the like, they are regarded as <100> orientation in a broad sense. This is because there is no lack in making domain engineering expressed since a <100> axis inclines by about 5° from a thickness direction also when such phases and a twin crystal are intermingled. In addition, although <100> orientation in the present invention means that the piezoelectric substance has <100> single crystal orientation in a thickness direction, it is called the <100> orientation even if a crystal axis has a tilt of several degrees, for example, a <100> crystal axis leans by about 5° from the thickness direction. In addition, {110} in the present invention is expression of generically naming a total of six planes generally expressed in (110), (101), (011), and the like, and its details are the same as those of the above-described treatment regarding orientation.

Generally, for example, [100] and [001] are the same when a crystal system is a cubic, but they should be distinguished in the case of monoclinic, tetragonal, or rhombohedral. However, even if being monoclinic, tetragonal, or rhombohedral, a crystals with the perovskite type structure which is represented by PMN-PT has lattice constants near those of a cubic. Hence, [100] and [001] of tetragonal, and [111] and [1 bar 1 bar 1 bar] of rhombohedral are named generically <100> and <111>. In addition, although the <100> orientation in the present invention means that a piezoelectric film has <100> single crystal orientation in a thickness direction, it has an inclination range of about several degrees. For example, it is called the <100> orientation even if a <100> crystal axis inclines by about 5° from the thickness direction.

Figure 3:
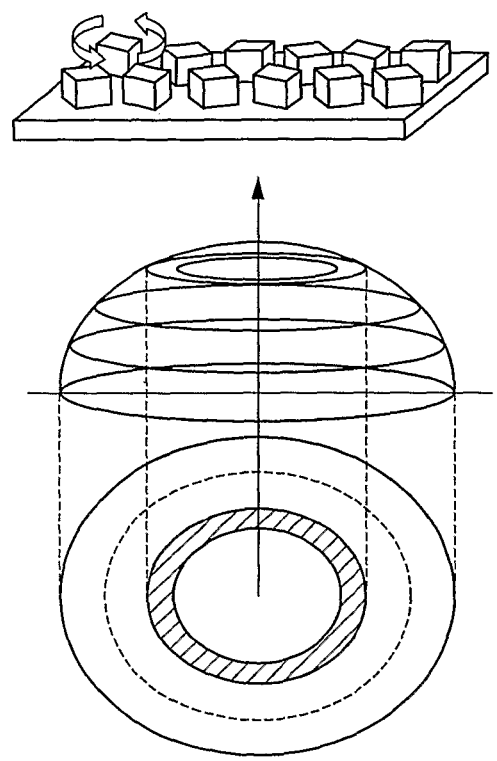
FIG. 3 is a schematic diagram of a uniaxial crystal of the present invention, and a dot diagram of positive electrode by X-ray diffraction.

In addition, although a uniaxial crystal in the present invention means a crystal having single crystal orientation in a thickness direction, intra-film orientation of the crystal does not matter especially. For example, a <100> uniaxial crystal is a film that a crystal with only <100> orientation is formed in its thickness direction. It can be confirmed using X-ray diffraction whether the piezoelectric film is the uniaxial crystal. For example, in the case of a <100> uniaxial orientation crystal, as for peaks resulting from the piezoelectric film in the 2θ/θ measurement of the X-ray diffraction, only peaks of {L00} planes (L=1, 2, 3, . . . , n: n is an integer), such as {100} and {200} are detected. In addition, when pole measurement of a {110} asymmetric surface is performed, as shown in FIG. 3, a ring-like pattern is obtained in the same radius position showing an inclination of about 45° from a center.

Figure 4:
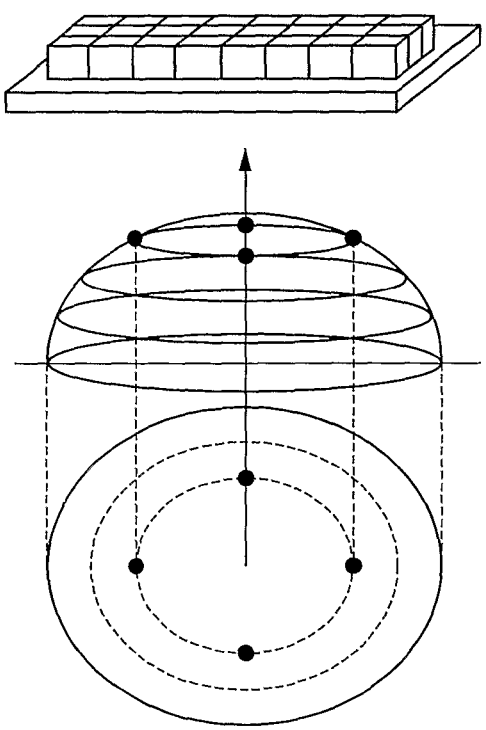
FIG. 4 is a schematic diagram of a single crystal of the present invention, and a dot diagram of positive electrode by X-ray diffraction.

In addition, the single crystal in the present invention means a crystal having single crystal orientation in a film thickness direction and an intra-film direction. For example, the <100> single crystal is a film made of crystals a film thickness direction of which is only <100> orientation, and in which a certain direction in an intra-film direction is only <110> orientation. It can be confirmed using X-ray diffraction whether the piezoelectric film is the uniaxial crystal. For example, in the case of a <100> single crystal, as for peaks resulting from the piezoelectric film in the 2θ/θ measurement of the X-ray diffraction, only peaks of {L00} planes (L=1, 2, 3, . . . , n: n is an integer), such as {100} and {200} are detected. In addition, when pole measurement of a {110} asymmetric surface is performed, as shown in FIG. 4, a quarter-symmetrical spot pattern is obtained in the same radius position showing an inclination of about 45° from a center.

Furthermore, in the present invention, since the following crystals are also crystals which have intermediate symmetry between a single crystal and a uniaxial crystal, this is regarded as a single crystal and a uniaxial crystal in a wide sense. (1) Crystal that an octagonally or dodecagonally symmetrical pattern is obtained in the same radius position showing an inclination of about 45° from a center, for example, when pole measurement of a {110} asymmetric surface is performed. (2) Crystal whose patterns is not a spot but an ellipse, for example, when pole measurement of a {110} asymmetric surface is performed. Similarly, in the present invention, for example, when a plurality of crystal phases, such as monoclinic and tetragonal, monoclinic and rhombohedral, and tetragonal and rhombohedral, and all of them are intermingled (mixed phase), when crystals resulting from a twin crystal and the like are intermingled, and also when there are a dislocation, a defect, and the like, they are regarded as a single crystal and a uniaxial orientation crystal in a broad sense.

Although crystal orientation of the piezoelectric film can be easily confirmed by the X-ray diffraction as mentioned above, besides the above-described X-ray diffraction, for example, it can be confirmed by sectional observation by a TEM etc. In this case, also in the case that crystal dislocation exists columnarly in a thickness direction or a twin crystal can be confirmed, it is regarded as a single crystal in a wide sense.

A crystal phase of a piezoelectric film can be specified by reciprocal space mapping of the X-ray diffraction. For example, when the piezoelectric film with <100> orientation is a cubic, the following reciprocal lattice points are obtained. That is, when reciprocal lattice points (004) and (204) of this cubic are measured in the reciprocal space mapping, relation between magnitude Qy(004) in a y-axis direction of a (004) reciprocal lattice point and magnitude Qy(204) in a y-axis direction of a (204) reciprocal lattice point becomes Qy(004)=Qy(204). Hence, such reciprocal lattice points that the relation between the magnitude Qy(004) in the y-axis direction of the (004) reciprocal lattice point and the magnitude Qx(204) in the x-axis direction of the (204) reciprocal lattice point may become Qy(004)=2Qx(204) can be obtained.

In addition, for example, when the piezoelectric film with <100> orientation is a cubic, the following reciprocal lattice points are obtained. That is, when reciprocal lattice points (004) and (204) of this cubic are measured in the reciprocal space mapping, relation between magnitude Qy(004) in the y-axis direction of the (004) reciprocal lattice point and magnitude Qy(204) in the y-axis direction of the (204) reciprocal lattice point becomes Qy(004)=Qy(204). That is, such reciprocal lattice points that the relation between the magnitude Qy(004) in the y-axis direction of the (004) reciprocal lattice point and the magnitude Qx(204) in the x-axis direction of the (204) reciprocal lattice point may become Qy(004) <2Qx(204) can be obtained.

Furthermore, for example, when the piezoelectric film with <100> orientation is a monoclinic, the following reciprocal lattice points are obtained. That is, when reciprocal lattice points (004) and (204) of this monoclinic are measured in the reciprocal space mapping, relation between magnitude Qy(004) in the y-axis direction of the (004) reciprocal lattice point and magnitude Qy(204) in the y-axis direction of the (204) reciprocal lattice point becomes as follows. Qy(004)>Qy(204), or Qy(004)<Qy(204). That is, such reciprocal lattice points that the relation between the magnitude Qy(004) in the y-axis direction of the (004) reciprocal lattice point and the magnitude Qx(204) in the x-axis direction of the (204) reciprocal lattice point may become Qy(004)<2Qx(204) can be obtained. At this time, it is no matter even if two (204) reciprocal lattice points which become Qy(004)>Qy(204) and Qy(004)<Qy(204) appear. It seems that these two reciprocal lattices have relation of a twin crystal.

In addition, for example, when the piezoelectric film with <100> orientation is rhombohedral, the following reciprocal lattice points are obtained. That is, when (004) and (204) of this rhombohedral are measured in the reciprocal space mapping, relation between magnitude Qy(004) in the y-axis direction of the (004) reciprocal lattice point and magnitude Qy(204) in the y-axis direction of the (204) reciprocal lattice point becomes as follows: Qy(004)>Qy(204), or Qy(004)<Qy(204). That is, such reciprocal lattice points that the relation between the magnitude Qy(004) in the y-axis direction of the (004) reciprocal lattice point and the magnitude Qx(204) in the x-axis direction of the (204) reciprocal lattice point may become Qy(004)≈2Qx(204) can be obtained. At this time, it is no matter even if two (204) reciprocal lattice points which become Qy(004)>Qy(204) and Qy(004)<Qy(204) appear. It seems that these two reciprocal lattices have relation of a twin crystal.

Similarly, also in another orientation or another crystal phase, a crystal phase of a piezoelectric film can be specified simply by the reciprocal space mapping of the X-ray diffraction. Besides the above-described method, it is possible to perform confirmation also by, for example, sectional observation by a TEM or the like. Here, the y-axis of a reciprocal space is a thickness direction of a piezoelectric film, and the x-axis is a certain direction in the intra-film direction of the piezoelectric film.

Figure 2:
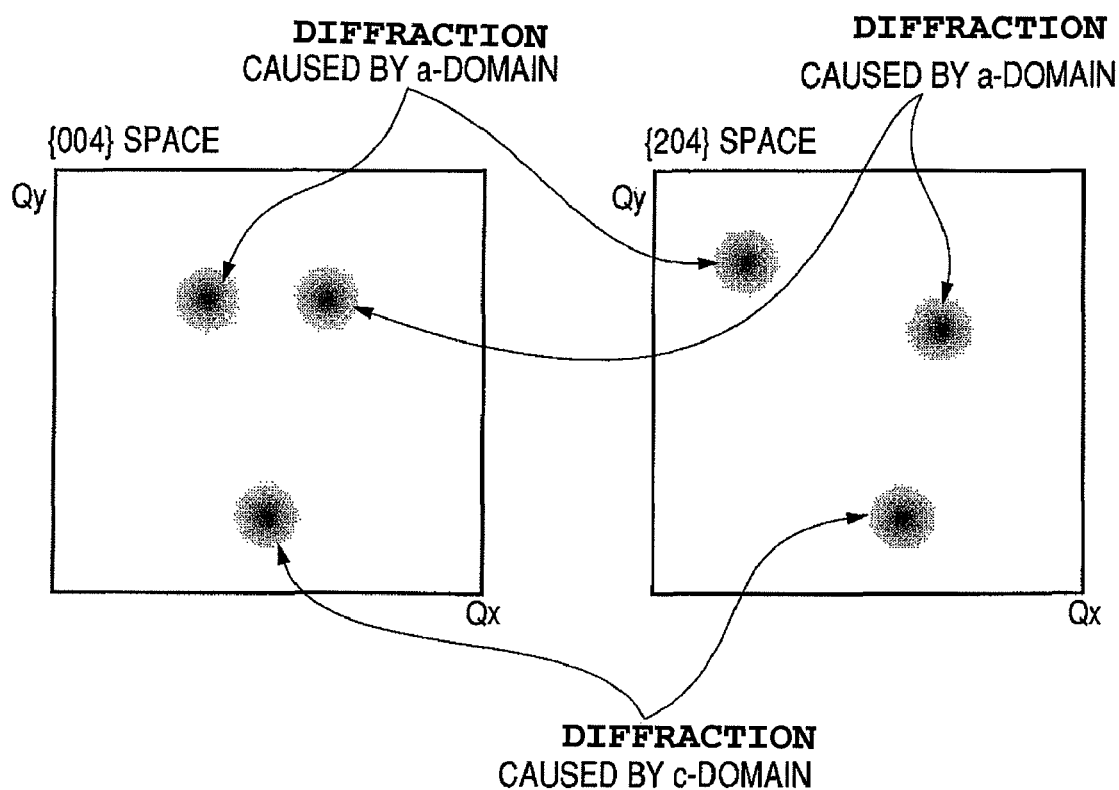
FIG. 2 is a schematic diagram of reciprocal lattice mapping by X-ray diffraction of a piezoelectric film of the present invention.

A twin crystal of a piezoelectric film can be specified simply by reciprocal space mapping of the X-ray diffraction and pole measurement. For example, in the case that a piezoelectric film with <001> orientation is a tetragonal and has a twin crystal which is illustrated in FIG. 1, when a {004} space and a {204} space are measured by reciprocal space mapping, diffraction as shown in FIG. 2 appears. That is, as illustrated in FIG. 2, diffraction (402) resulting from an a-domain of the twin crystal appears near the diffraction (204) resulting from a c-domain. At this time, some shift (angle shift from a reciprocal space origin of the c-domain and a-domain in the {004} space) of orientation generated with a twin crystal becomes magnitude of an extent of subtracting 90° from two times of an angle which has tangential relation with a-axis length and c-axis length of a crystal lattice of tetragonal.

Although a twin crystal of the piezoelectric film can be easily confirmed by the X-ray diffraction as mentioned above, besides the above-described X-ray diffraction, for example, it can be confirmed by sectional observation by a TEM and the like.

(Forming Method of Piezoelectric Film)

Although a forming method of the piezoelectric film of the present invention is not limited particularly, in regard to a thin film of 10 µm or less, usually, thin film forming methods such as a sol gel method, a hydrothermal crystallization method, a gas deposition method, and an electrophoresis can be used. Furthermore, thin film forming methods such as a sputtering method, a chemical vapor phase deposition method (CVD method), a metal-organic chemical vapor deposition (MOCVD method), an ion beam deposition method, a molecular beam epitaxy method, and a laser ablation method can be used. In these thin film forming methods, formation of a piezoelectric film by using epitaxial growth from a substrate or a base electrode can be performed.

Figure 5:
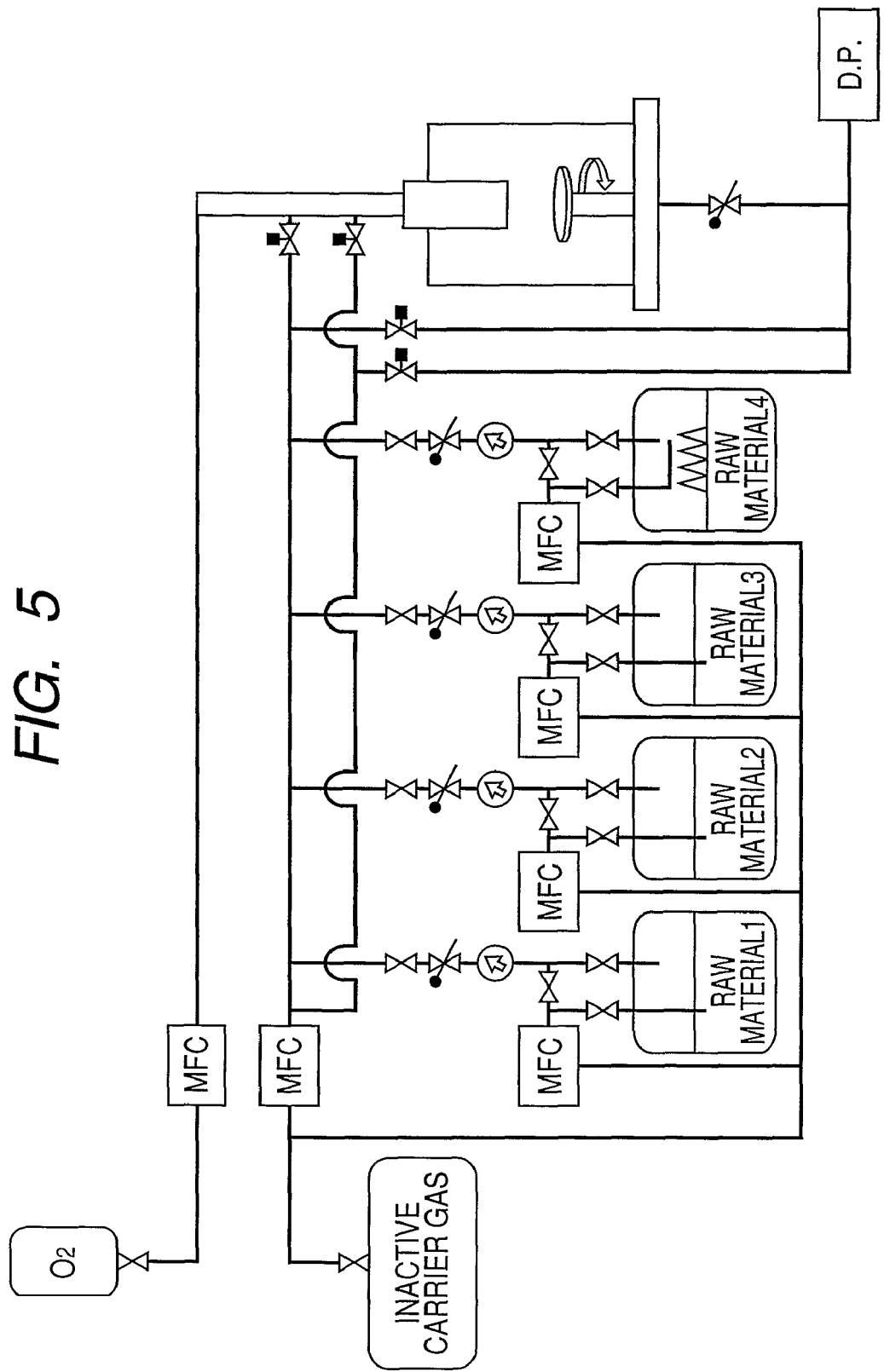
FIG. 5 is a schematic diagram illustrating an example of a pulsed MOCVD method in the present invention.

It is suitable to obtain it by forming a film as a film formation method in particular by the pulsed MOCVD method using the apparatus illustrated in FIG. 5 also among the above-mentioned various methods.

In the pulsed MOCVD method, it is suitable to perform temperature control of a starting material supply route so that an oxidation reaction which obstructs single crystal film formation in piping may not proceed. Furthermore, in the pulsed MOCVD method, it is suitable to supply intermittently a mixed gas of an inactive carrier gas and a starting material. At this time, by controlling intermittent time of the mixed gas, sufficient reaction time of the mixed gas on the substrate is obtained, and hence, damage of a film and the like can be suppressed. In consequence, defects generated by oxygen deficiency in the piezoelectric film, a lead defect, a lattice site defect of each constituent element which constructs a crystal lattice, and the like can be suppressed. It is suitable to use a production method with a high film formation rate as a method of being easy to obtain in particular crystal structure of the present invention. For that purpose, it is suitable to make a supply amount of a material gas large and to make partial pressure of $O_2$ high so that an oxide film may be made without a defect.

Figure 6:
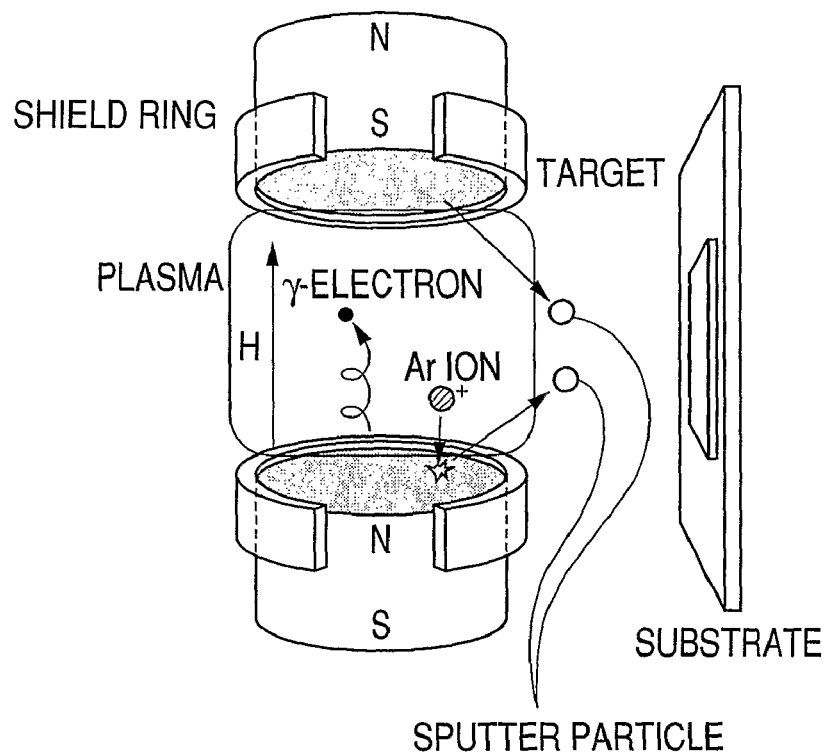
FIG. 6 is a schematic diagram illustrating an example of a magnetron sputtering method in the present invention.

Furthermore, a magnetron sputtering method using an apparatus as illustrated in FIG. 6 is suitable in particular as a film formation method. The apparatus illustrated in FIG. 6 has construction of enabling arrangement of pair of targets and a substrate for film formation in a position provided so as to face a space formed by these targets. The pair of targets is arranged in a position which does not include a region where a target region in a direction perpendicular to sputtering faces of the targets is projected, and more suitably, with being opposite in parallel with a gap. Furthermore, respective magnetic field generation units whose polarities are mutually different are arranged on respective target backsides so as to contact respective target backsides. A substrate on which a thin film is formed on a surface heated in 400° C. to 800° C. (both inclusive) is arranged in a position provided so as to face a space formed by the targets. According to film formation using an apparatus with such construction, a piezoelectric thin-film element in which a volume of a unit lattice of a piezoelectric film is smaller than a volume of a unit lattice of a bulk material which is at the same temperature and in the same composition as those of the piezoelectric film, and which has high piezoelectricity can be formed. In particular, in the sputtering method among film methods, damage of a film by plasma, and gamma electrons, damage of the film by negative ions being generated from a sputtering gas and being accelerated by a magnetron magnetic field in a substrate direction, and the like may be serious in many cases. In consequence, it seems that there are many defects generated by oxygen deficiency in a crystal, a lead defect, a lattice site defect of each constituent element which constructs a crystal lattice, and the like. Nevertheless, when the sputtering method mentioned above is used, the damage of the film by plasma, gamma electrons, and a sputtering gas, and the like can be suppressed. Thereby, defects generated by oxygen deficiency in the piezoelectric film, a lead defect, a lattice site defect of each constituent element which constructs a crystal lattice, and the like can be suppressed, and the piezoelectric thin-film element which is smaller than a volume of a unit lattice of a bulk material, and which has high piezoelectricity can be formed easily.

(Electrodes, Substrate, and Buffer Layer)

It is suitable that a first electrode (electrode film) or a second electrode (electrode film) of the piezoelectric element of the present invention has good adhesion with the above-mentioned piezoelectric substance, and is made from a highly conductive material. That is, it is suitable to be made from a material of being able to make specific resistance of an upper electrode film or a lower electrode film $10^{-7}$ to $10^{-2}$ $\Omega \cdot cm$. Although such a material is generally a metal in many cases, it is suitable to use a metal of a Pt group, such as Au, Ag, Cu, Ru, Rh, Pd, Os, Ir, or Pt, as an electrode material. In addition, since an alloy material which includes the above-mentioned material, such as silver paste or solder also has high electro-conductivity, it is possible to use it suitably. In addition, conductive oxide materials, such as IrO (iridium oxide), SRO (strontium ruthenate), ITO (conductive tin oxide), and BPO (barium plumbate), are also suitable as electrode materials. In addition, either one-layer structure or multilayer structure may be sufficient as the electrode film. For example, in order to increase adhesion with a substrate, such construction as Pt/Ti may be adopted, or in order to perform epitaxial growth from a substrate or a buffer layer, such construction as SRO/LNO (lanthanum nickelate) may be adopted.

In addition, when the piezoelectric film of the present invention is formed from an epitaxial oxide film, it is more suitable that the first electrode is also a single crystal body or an epitaxial film. Since the piezoelectric film of the present invention includes perovskite multiple oxide which is made of the general formula $ABO_3$, its lattice constant is about 4 Å. Then, a material which has a lattice constant of about 4 Å is suitable as an electrode material. For example, in particular among the above-mentioned materials, Pt group metal, such as SRO, or BPO is suitable. Furthermore, when he first electrode film contains an oxide electrode film with the perovskite type structure which is given <100> orientation, a uniaxial film or a single crystal film which is given <100> orientation can be produced easily. In particular, since SRO has a lattice constant of about 4 Å close to a lattice constant of PZT and single crystallization of a film is also easy, an epitaxial piezoelectric film can be produced more easily.

Furthermore, a film thickness of the electrode film is suitable to be about 100 to 1000 nm, and it is further suitable to be 500 nm or less. When the film thickness of the electrode film is made 100 nm or more, resistance of the electrode film becomes small enough, and when 1000 nm or less, there is no possibility of obstructing the piezoelectricity of the piezoelectric film element, and hence, it is suitable.

As a substrate which forms the piezoelectric film, what has a buffer layer on a glass substrate or a Si substrate is suitable. In the present invention, although an STO (strontium titanate) substrate, a sapphire substrate, a KTO (potassium tantalate) substrate, etc. may be used besides a Si substrate and a glass substrate, the glass substrate and the Si substrate are suitable on device production. In particular, a substrate which has a surface whose part (what is made of such Si entirely may be sufficient) is made of Si which is (100), and a buffer layer is formed thereon is suitable in particular. When, for example, an MgO (magnesium oxide) (100) monocrystalline substrate is used as a substrate, it becomes a film with many c-domains, or a polycrystalline film.

As a suitable buffer layer, an oxide layer with fluorite structure, such as a YSZ (stabilized zirconia) film which is given <100> orientation, or an oxide layer with magnesia spinel type structure, such as an $MgAl_2O_4$ (magnesia spinel) film which is given <100> orientation can be cited. In addition, it can be formed using metal oxide, such as STO, MgO, and $CeO_2$ (cerium oxide). As the buffer layer, one on which a film which includes perovskite type oxide which can be used suitably as an electrode layer, for example, an SRO single crystal film which is given <100> orientation can be formed is suitable. For example, a substrate which has a most suitable buffer layer of the present invention has single crystal construction with <100> orientation such as an LNO(100)/$CeO_2$(100)/YSZ(100)/Si(100) substrate. A film thickness of the buffer layer can be selected from a range of 10 nm to 800 nm (both inclusive).

Although forming methods of the electrode film and the buffer layer are not limited particularly, a thin film of 1000 nm or less can be usually formed using thin film forming methods such as the sol gel method, hydrothermal crystallization method, gas deposition method, and electrophoresis. Furthermore, it is possible to form it using thin film forming methods such as the sputtering method, CVD method, MOCVD method, ion beam deposition method, molecular beam epitaxy method, and laser ablation method. Since these thin film forming methods enables to form the piezoelectric film using epitaxial growth from a substrate or a buffer layer, it becomes easy to form an epitaxial piezoelectric film.

(Liquid Discharge Head)

Next, a liquid discharge head of the present invention will be described.

The liquid discharge head of the present invention includes a discharge port, and a piezoelectric element for discharging a liquid from the discharge port, and includes a piezoelectric element (piezoelectric thin-film element) with the above-mentioned construction as such a piezoelectric element. Furthermore, integration of the piezoelectric element to the liquid discharge head can be achieved by providing an individual liquid chamber communicated with a discharge port, making a part of the individual liquid chamber including a diaphragm, and arranging the piezoelectric thin-film element in a position of giving vibration to the diaphragm provided in exterior of the individual liquid chamber.

In this liquid discharge head, the liquid in the individual liquid chamber is discharged from the discharge port by a volume change in the individual liquid chamber which is generated by the diaphragm. Then, this liquid discharge head is characterized by using a piezoelectric thin-film element, which uses a piezoelectric film with the above-mentioned construction, as the above-mentioned piezoelectric thin-film element. By using the piezoelectric thin-film element with the above-mentioned construction relating to the present invention, the liquid discharge head which exhibits uniform and high discharging performance and enables miniaturization of a structural pattern of a discharge pressure generation element including the piezoelectric thin-film element can be obtained easily. The liquid discharge head of the present invention may be used for image forming apparatuses, such as an ink-jet printer, a fax, a compound machine, and a copier, or industrial discharge apparatuses of discharging a liquid other than ink.

Figure 8:
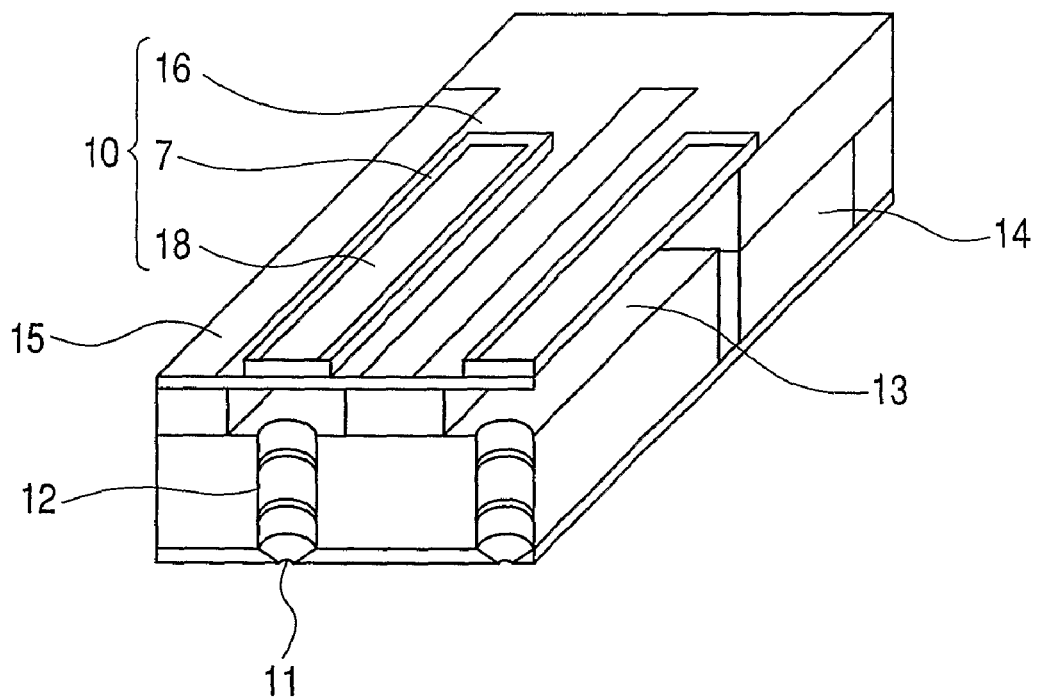
FIG. 8 is a partially schematic perspective view of construction of a liquid discharge head.

The liquid discharge head of the present invention will be described with referring to FIG. 8. FIG. 8 is a schematic diagram showing an example of an embodiment of the liquid discharge head of the present invention. The liquid discharge head of this embodiment shown in FIG. 8 includes a discharge port 11, a communication hole 12 which makes the discharge port 11, and an individual liquid chamber 13 communicate with each other, and a common liquid chamber 14 which supplies a liquid to the individual liquid chamber 13, and, the liquid is supplied to the discharge port 11 along with this communicated route. A part of the individual liquid chamber 13 includes a diaphragm 15. The piezoelectric thin-film element 10 for giving vibration to the diaphragm 15 is provided in the exterior of the individual liquid chamber 13. When the piezoelectric thin-film element 10 is driven, the diaphragm 15 is given the vibration by the piezoelectric thin-film element 10, and causes a volume change in the individual liquid chamber 13, and thereby, the liquid in the individual liquid chamber 13 is discharged from the discharge port. Although the piezoelectric thin-film element 10 is rectangular in the embodiment shown in FIG. 9 mentioned later, this shape may be also elliptical, circular, and parallelogramic.

Figure 9:
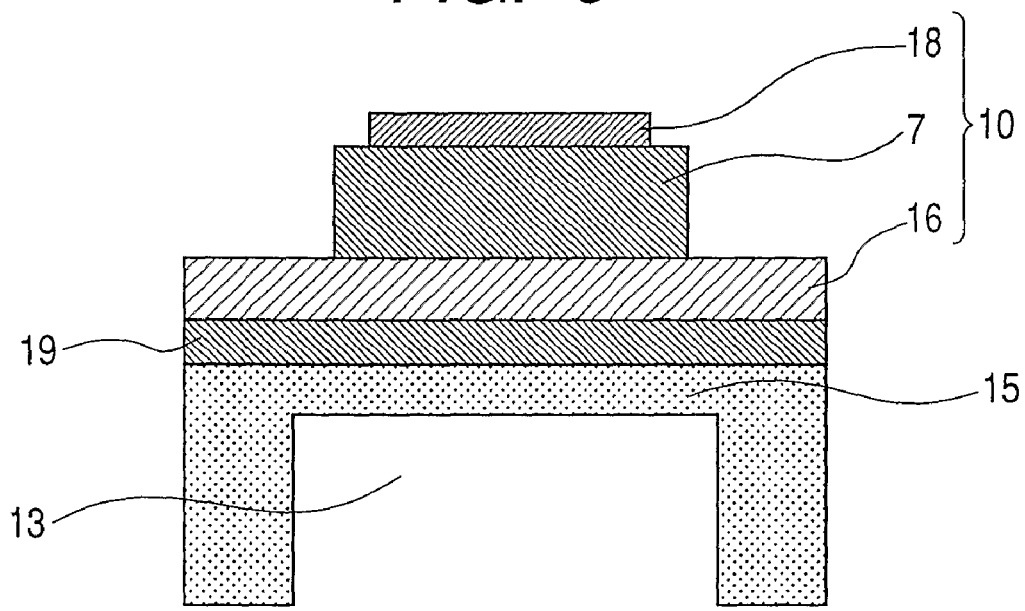
FIG. 9 is a sectional schematic diagram in a width direction of the liquid discharge head illustrated in FIG. 8.

FIG. 9 illustrates a sectional schematic diagram in a width direction of the liquid discharge head illustrated in FIG. 8. The piezoelectric thin-film element 10 which constructs the liquid discharge head of the present invention will be described further in detail with referring to FIG. 9. Although a sectional shape of the piezoelectric thin-film element 10 is shown by a rectangle, a trapezoid or an inverted trapezoid may be also sufficient. In addition, although the first electrode film 6 is equivalent to the lower electrode film 16 and the second electrode film 8 is equivalent to the upper electrode film 18 in FIG. 9, the first electrode film 6 and second electrode film 8 which construct the piezoelectric thin-film element 10 of the present invention may be made the lower electrode film 16 and upper electrode film 18 respectively, and vice versa. This is based on a production method at the time of device production, and either can obtain the effect of the present invention. In addition, the diaphragm 15 may be formed from the substrate 5 which constructs the piezoelectric thin-film element 10 of the present invention. In addition, there may be a buffer layer 19 between the diaphragm 15 and lower electrode film 16.

Figure 10:
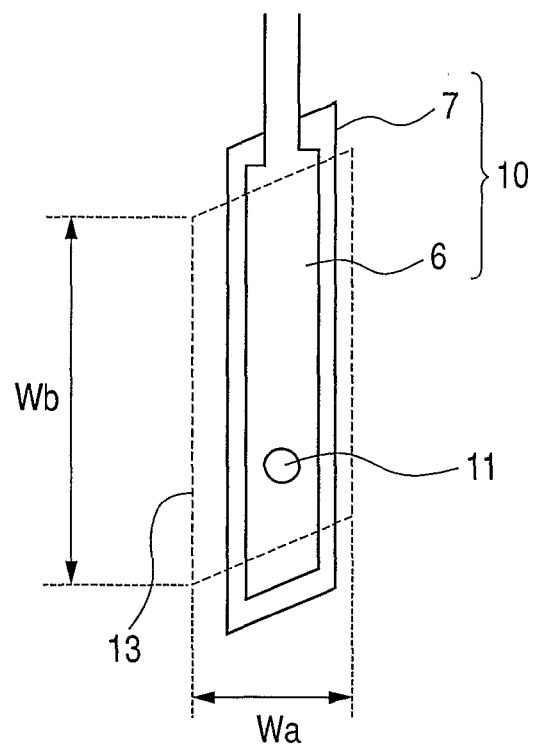
FIG. 10 is a schematic diagram of the liquid discharge head illustrated in FIG. 8 viewed from a top face side (discharge port side).
Figure 11:
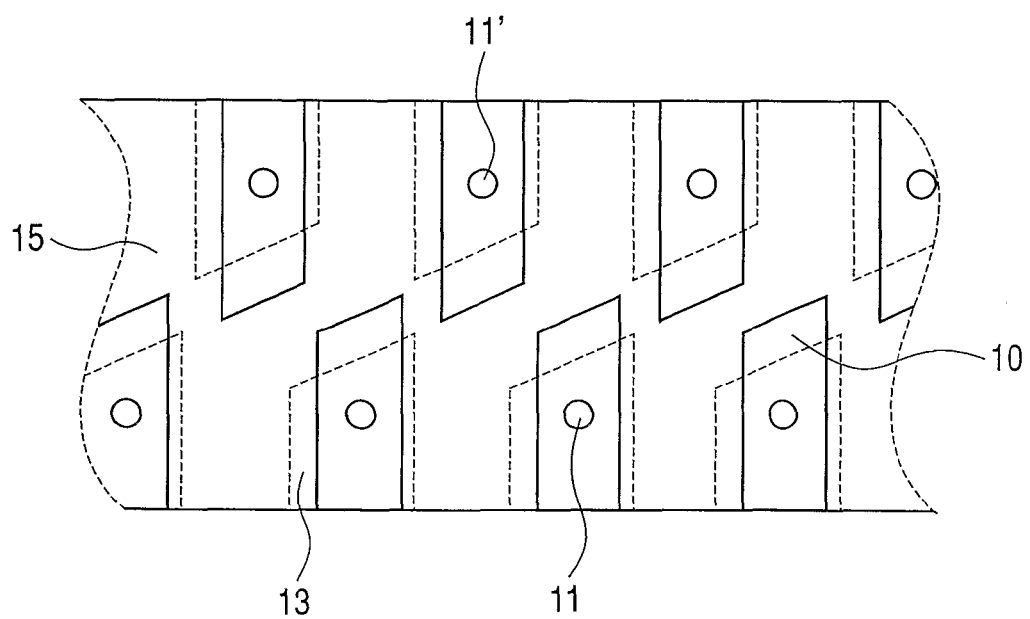
FIG. 11 is a schematic diagram of the liquid discharge head illustrated in FIG. 8 viewed from the top face side (discharge port side).

FIGS. 10 and 11 are schematic diagrams of the liquid discharge head, illustrated in FIG. 8, with viewing from a top face side (discharge port 11 side). A region 13 shown by a dotted line expresses the individual liquid chamber 13 to which pressure is applied. The piezoelectric thin-film element 10 is patterned suitably and formed on the individual liquid chamber 13. For example, in FIG. 10, the lower electrode film 16 is drawn out to a portion in which the piezoelectric substance 7 does not exist, and the upper electrode film 18 (not shown) is drawn out to an opposite side of the lower electrode film 16 and is connected to a drive source. Although FIGS. 10 and 11 illustrate a state that the lower electrode film 16 is patterned, it may exist in a portion where the piezoelectric substance 7 does not exist as illustrated in FIG. 9. When there is no trouble, such as a short or disconnection, between a drive circuit and the piezoelectric thin-film element 10 when driving the piezoelectric thin-film element 10, the piezoelectric substance 7, lower electrode film 16, and upper electrode film 18 can be optimally patterned in accordance with an object. In addition, a reason why a shape of the individual liquid chamber 13 is shown in a parallelogram is because it becomes such a shape when an individual liquid chamber is produced by wet etching by alkali using a Si (110) substrate as a substrate. Besides this, the shape of the individual liquid chamber 13 may be either a rectangle or a square. Generally, although two or more individual liquid chambers 13 are produced in fixed intervals on the diaphragm 15, as illustrated in FIG. 11, the individual liquid chambers 13 may be disposed in staggered arrangement, or the number of them may be one depending on an object.

A thickness of the diaphragm 15 is usually 0.5 to 10 μm, and is 1.0 to 6.0 μm suitably. When there is the above-mentioned buffer layer 19, the thickness of the buffer layer is also included in this thickness. In addition, a plurality of layers besides the buffer layer may be formed. For example, when forming a diaphragm and an individual liquid chamber from the same substrate, a required etch stop layer and the like may be included. A width Wa (refer to FIG. 10) of the individual liquid chamber 13 is usually 30 to 180 μm. Although a length Wb (refer to FIG. 10) is based also on an amount of discharge liquid droplets, it is usually 0.3 to 6.0 mm. A form of the discharge port 11 is usually a circular or a star, and a diameter is suitably 7 to 30 μm usually. It is suitable that a sectional shape of the discharge port 11 is a tapered shape expanded in a direction of the communication hole 12. A length of the communication hole 12 is usually 0.05 to 0.5 mm suitably. When the length of the communication hole 12 is made 0.5 mm or less, discharging speed of a liquid droplet becomes fast enough. In addition, when being 0.05 mm or more, dispersion in the discharging speed of a liquid droplet which is discharged from each discharge port becomes small suitably. In addition, members which form the diaphragm, individual liquid chamber, common liquid chamber, communication hole, and the like which construct the liquid discharge head of the present invention may be the same material, or may be different materials, respectively. For example, when it is Si and the like, it is processible with sufficient accuracy by using a lithography method and an etching method. In addition, as members selected when different ones, materials, difference among coefficients of thermal expansion of which is $1 \times 10^{-8}/°$ C. to $1 \times 10^{-6}/°$ C., are suitable. For example, it is suitable to select an SUS substrate, Ni substrate, and the like to an Si substrate.

Although it is suitable that the piezoelectric film of the present invention is an epitaxial film with <100> orientation, it is suitable that crystal orientation in an intra-film direction of the piezoelectric film in the liquid discharge head of the present invention has <100> orientation in a longitudinal direction of the piezoelectric thin-film element. In addition, this longitudinal direction is a direction of Wb in FIG. 10.

(Production Method of Liquid Discharge Head)

Next, a production method of the liquid discharge head of the present invention will be described. A representative example of the production method of a liquid discharge head of the present invention has at least the following steps:
(1) Step of forming discharge port.
(2) Step of forming communication hole making discharge port and individual liquid chamber communicate.
(3) Step of forming individual liquid chamber.
(4) Step of forming common liquid chamber communicating with individual liquid chamber.
(5) Step of forming diaphragm giving vibration to individual liquid chamber.
(6) Step of producing piezoelectric thin-film element of the present invention for giving vibration to diaphragm provided in exterior of individual liquid chamber.

Specifically, for example, as a first method of producing the liquid discharge head of the present invention, a method to be described next can be mentioned. First, with applying the step (3), a part of the individual liquid chamber and the diaphragm are formed in the substrate on which the piezoelectric thin-film element 10 is formed by applying the above-mentioned step (6). A substrate on which the communication hole and the common liquid chamber are formed with applying steps (2) and (4) separately, and a substrate having the discharge port with applying step (1) are produced. Next, the above-mentioned substrates and these substrates are stacked and unified, and the liquid discharge head is produced.

In addition, as a second method of producing the liquid discharge head of the present invention, a method to be described next can be mentioned. First, separately, a substrate on which an individual liquid chamber is formed with applying step (3), or a substrate on which an individual liquid chamber is formed is produced. Next, the piezoelectric thin-film element, or the diaphragm and piezoelectric thin-film element are transferred on this from the substrate on which the piezoelectric thin-film element is formed with applying step (6) or the substrate on which the diaphragm and piezoelectric thin-film element are formed at steps (5) and (6). Next, the individual liquid chamber is formed by processing a substrate portion in a side, which faces the piezoelectric thin-film element and the like, of the substrate, on which the piezoelectric thin-film element, or the diaphragm and piezoelectric thin-film element are transferred, with applying step (2). Further, similarly to the above-described first method, the substrate on which the communication hole and common liquid chamber are formed, and the substrate on which the discharge port is formed are produced, and these substrates are stacked and unified for the liquid discharge head to be produced.

Figure 12:
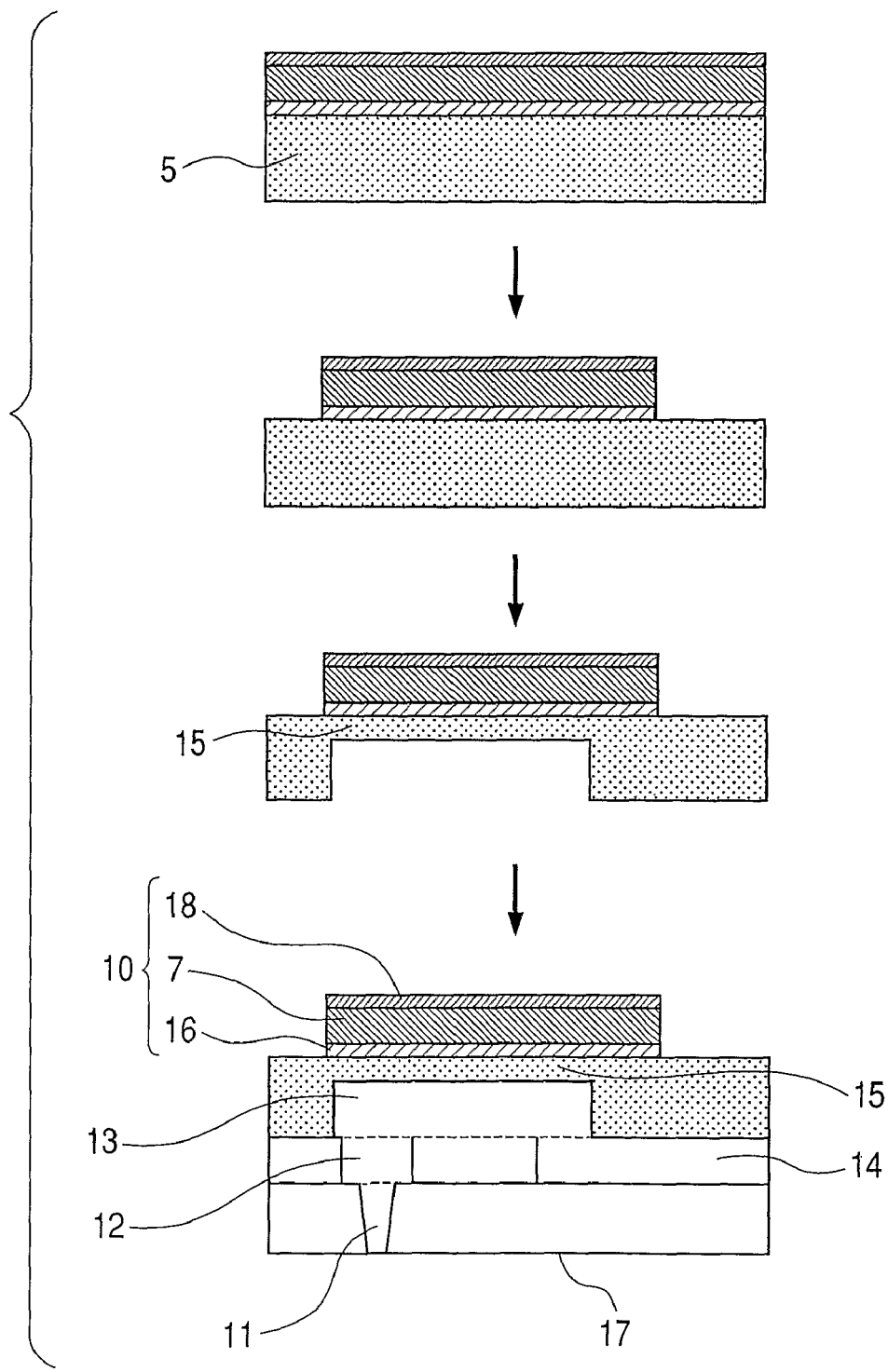
FIG. 12 is a schematic diagram illustrating an example of a production process of a liquid discharge head of the present invention.

As the first method, as illustrated in FIG. 12, first, similarly to the production method of the piezoelectric thin-film element, the piezoelectric thin-film element 10 is provided on the substrate 5. Next, the diaphragm 15 is formed while removing a part of the substrates 5 in a state of patterning the piezoelectric thin-film element 10 to form a part of the individual liquid chamber 13. Separately, a substrate which has the common liquid chamber 14 and communication hole 12 is produced, and further, a substrate on which the discharge port 11 is formed is produced. Furthermore, a production method of stacking and integrating these to form the liquid discharge head can be mentioned. As a method of removing a part of the substrates 5, a method, such as a wet etching method, a dry etching method, or a sand mill method can be mentioned. It can be performed to form a part of the diaphragm 15 and individual liquid chamber 13 by removing a part of the substrate 5 by such a method.

Figure 13:
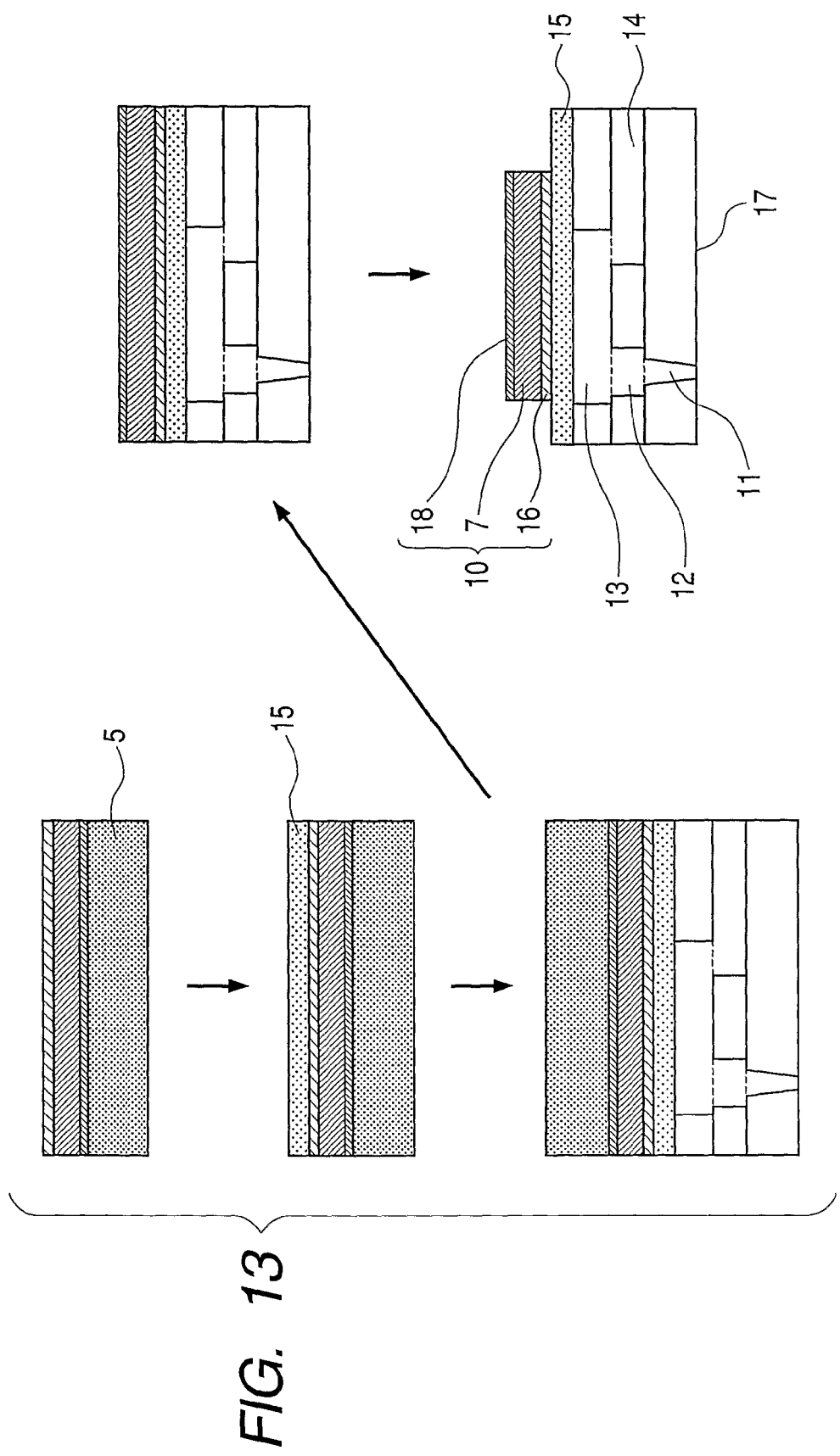
FIG. 13 is a schematic diagram illustrating an example of a production process of the liquid discharge head of the present invention.

As the second method, for example, as illustrated in FIG. 13, first, similarly to the production method of the piezoelectric thin-film element, the piezoelectric thin-film element 10 is provided on the substrate 5. Next, a substrate on which the diaphragm 15 is formed as a film on the piezoelectric thin-film element in a state that the piezoelectric thin-film element 10 is not patterned is produced. It can be performed to mention a production method of further producing a substrate of providing the individual liquid chamber 13, a substrate of providing the communication hole 12 and common liquid chamber 14, a substrate of providing the discharge port 11, and the like, stacking these thereafter, and transferring the diaphragm, piezoelectric thin-film element, and the like from the above-mentioned substrates.

Figure 14:
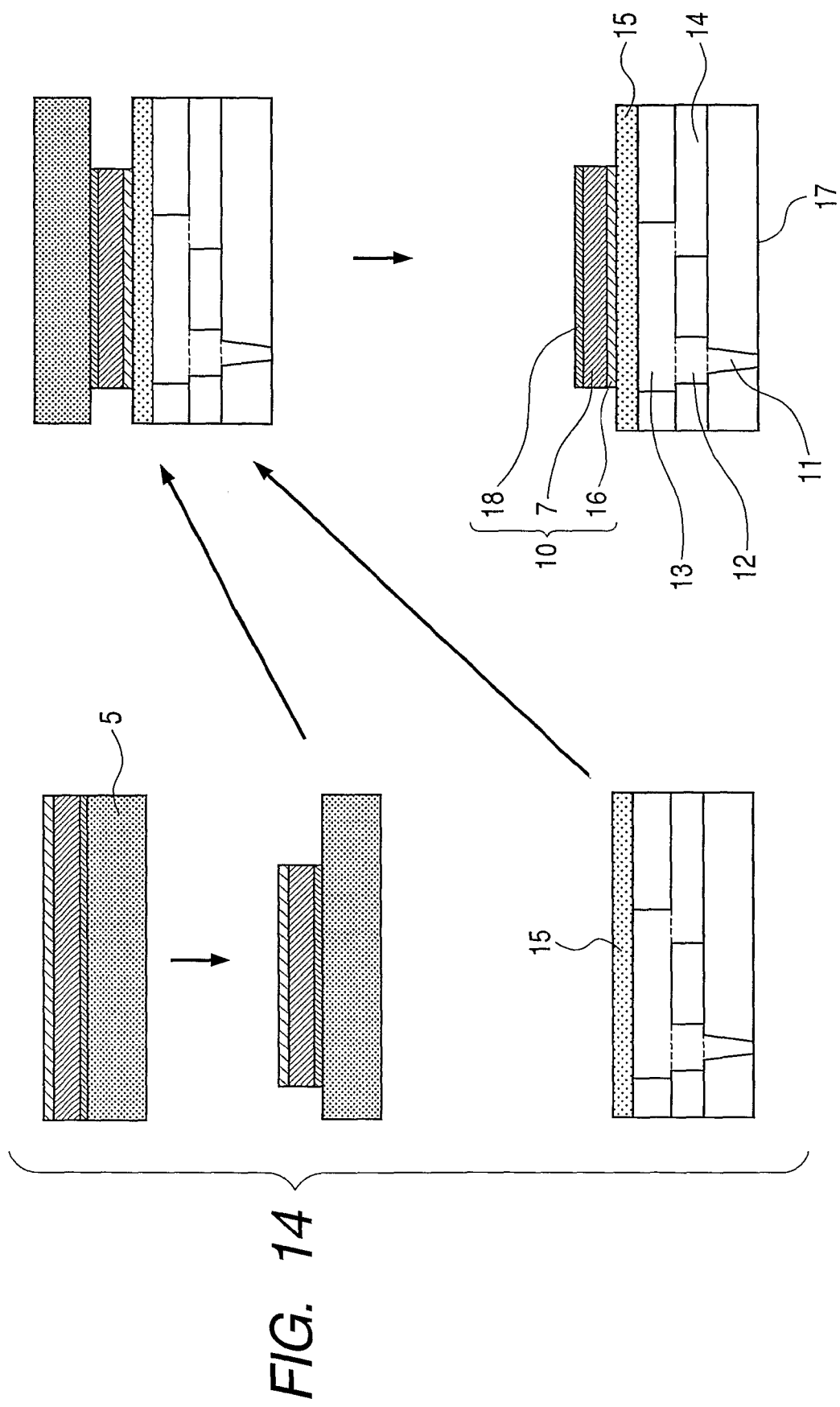
FIG. 14 is a schematic diagram illustrating an example of a production process of the liquid discharge head of the present invention.
Figure 15A:
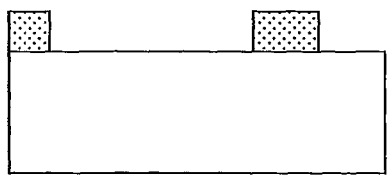
FIGS. 15A, 15B, 15C, 15D, 15E and 15F are schematic diagrams illustrating an example of a production process of the liquid discharge head of the present invention.
Figure 15B:
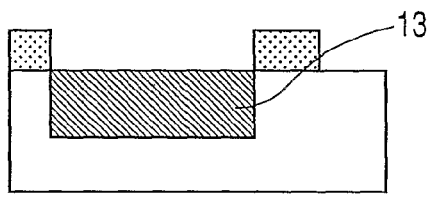
Figure 15C:
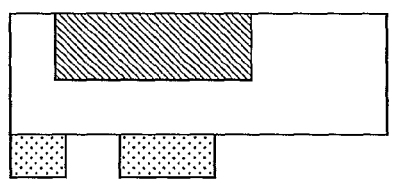
Figure 15D:
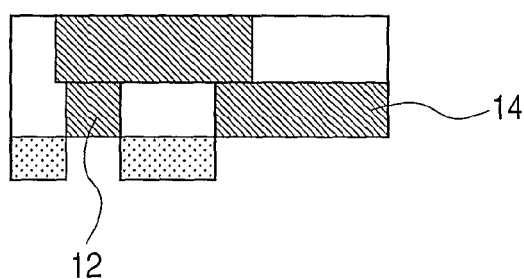
Figure 15E:
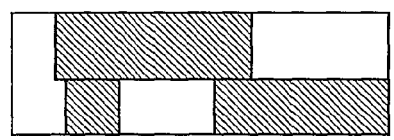
Figure 15F:
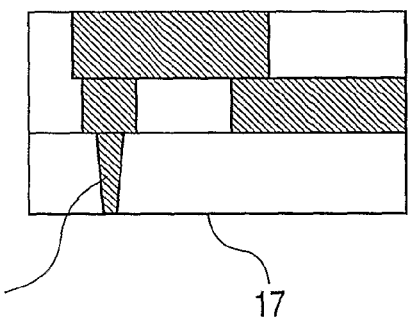

Moreover, as illustrated in FIG. 14, first, the piezoelectric thin-film element 10 is formed on the substrate 5, and this is patterned for the piezoelectric thin-film element to be formed. Separately, a substrate of providing the diaphragm 15 on the substrate and further providing a part of the individual liquid chamber 13, a substrate of providing the common liquid chamber 14 and communication hole 12, and a substrate of forming the discharge port 11 are produced. It can be performed to mention a production method of further stacking these, and transferring the piezoelectric thin-film element 10 on this from the above-mentioned substrate to form the liquid discharge head.

As a bonding method at the time of transfer, although a method of using an inorganic adhesive or an organic adhesive may be used, metal bonding by an inorganic material is more suitable. As a material used for the metal bonding, it is possible to mention In, Au, Cu, Ni, Pb, Ti, Cr, Pd, and the like. Since bonding can be performed at a low temperature of 300° C. or less and difference between a coefficient of thermal expansion and that of the substrate becomes small when these are used, there is also little damage to the piezoelectric thin-film element while it can be performed to avoid a problem by warpage of the piezoelectric thin-film element and the like when being elongated.

It can be performed to form the communication hole 12 and common liquid chamber 14 in the first method, and the individual liquid chamber 13, communication hole 12, and common liquid chamber 14 in the second method by processing and forming, for example, a forming member (substrate). A method of having the step of patterning a forming member (substrate) by lithography, and a step of removing a part of the member by etching can be used for this processing. For example, in the case of the second method, the individual liquid chamber 13, communication hole 12, and common liquid chamber 14 are formed by steps a) to e) illustrated in FIGS. 15A to 15F. Step a) illustrates a forming step of a mask for the individual liquid chamber 13, and step b) illustrates a step of processing the individual liquid chamber 13 (a hatched portion means a processed portion) by etching and the like from an upper portion. In addition, step c) illustrates a step of removing the mask used for the formation of the individual liquid chamber 13, and forming a mask for the communication hole 12 and common liquid chamber 14, and step d) illustrates a step of processing the communication hole 12 and common liquid chamber 14 by etching and the like from a lower portion. Moreover, step e) schematically illustrates a state of removing the mask used for the formation of the communication hole 12 and common liquid chamber 14 to form the individual liquid chamber 13, communication hole 12, and common liquid chamber 14. The discharge port 11 is formed by giving etching processing, machining, laser processing, or the like to the substrate 17. Step f) illustrates a state that the substrate 17 in which the discharge port 11 is formed is bonded to the substrate, in which the individual liquid chamber 13, communication hole 12, and common liquid chamber 14 are formed, after step e). It is suitable that a surface of the substrate 17 in which the discharge port is provided is water-repellent. Although a bonding method of respective substrates is the same as the bonding method at the time of transfer, anodic oxidation bonding may be also used.

In the second method, it is suitable to use another substrate, to which the piezoelectric thin-film element 10 on the substrate 5 is transferred, in a state of step e) or f) of FIGS. 15A to 15F. Here, when the diaphragm is formed on the piezoelectric thin-film element on the substrate 5, it is directly transferred on the individual liquid chamber 13 in the state of step e) or f) of FIGS. 15A to 15F. In addition, when the diaphragm is not formed on the piezoelectric thin-film element on the substrate 5, a hole of the individual liquid chamber 13 in the state of step e) or f) of FIGS. 15A to 15F is filled up with a resin for the diaphragm to be formed as a film, and it is transferred after this resin being removed by etching and the diaphragm is formed. At this time, it is suitable to form the diaphragm using a thin film forming method such as the sputtering method or CVD method. In addition, the pattern forming step of the piezoelectric thin-film element 10 may be either before or after the transfer.

Next, a liquid discharge apparatus of the present invention will be described. The liquid discharge apparatus of the present invention has the above-mentioned liquid discharge head of the present invention.

Figure 16:
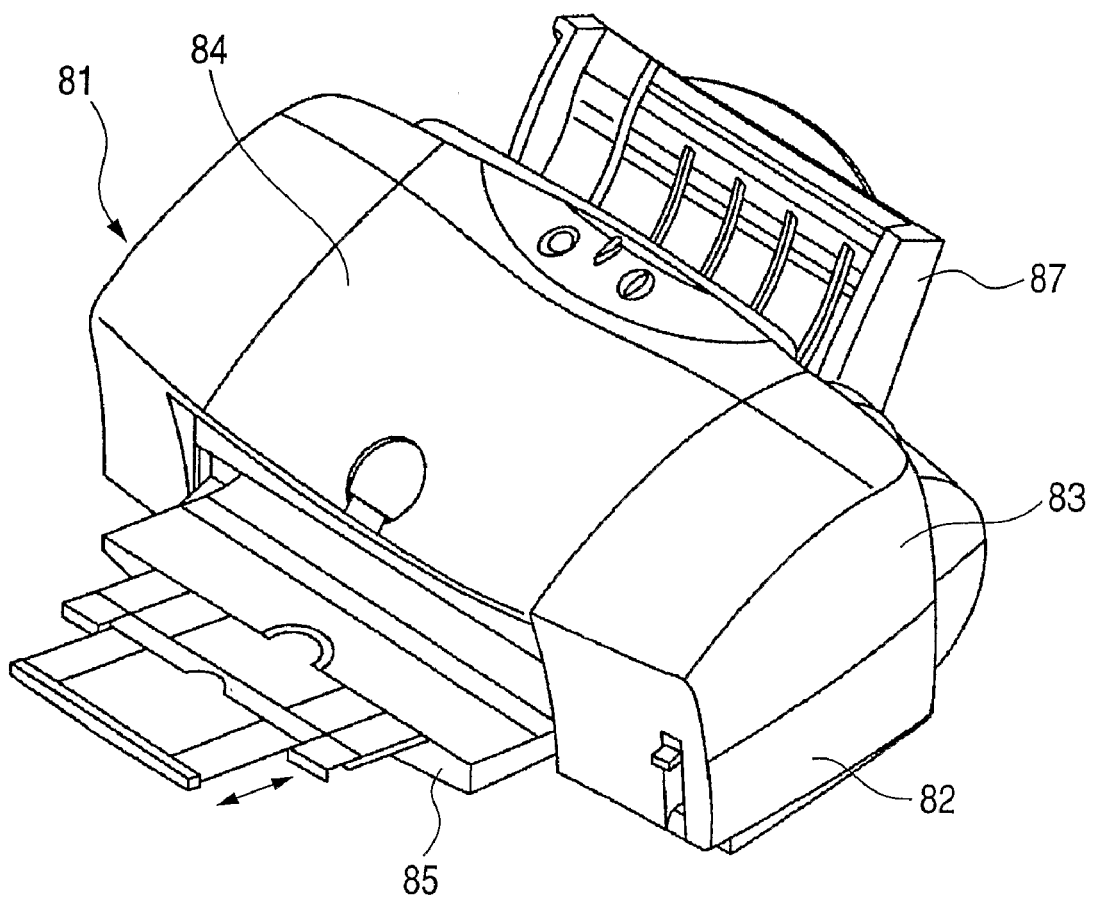
FIG. 16 is a perspective view illustrating an example of a liquid discharge apparatus.
Figure 17:
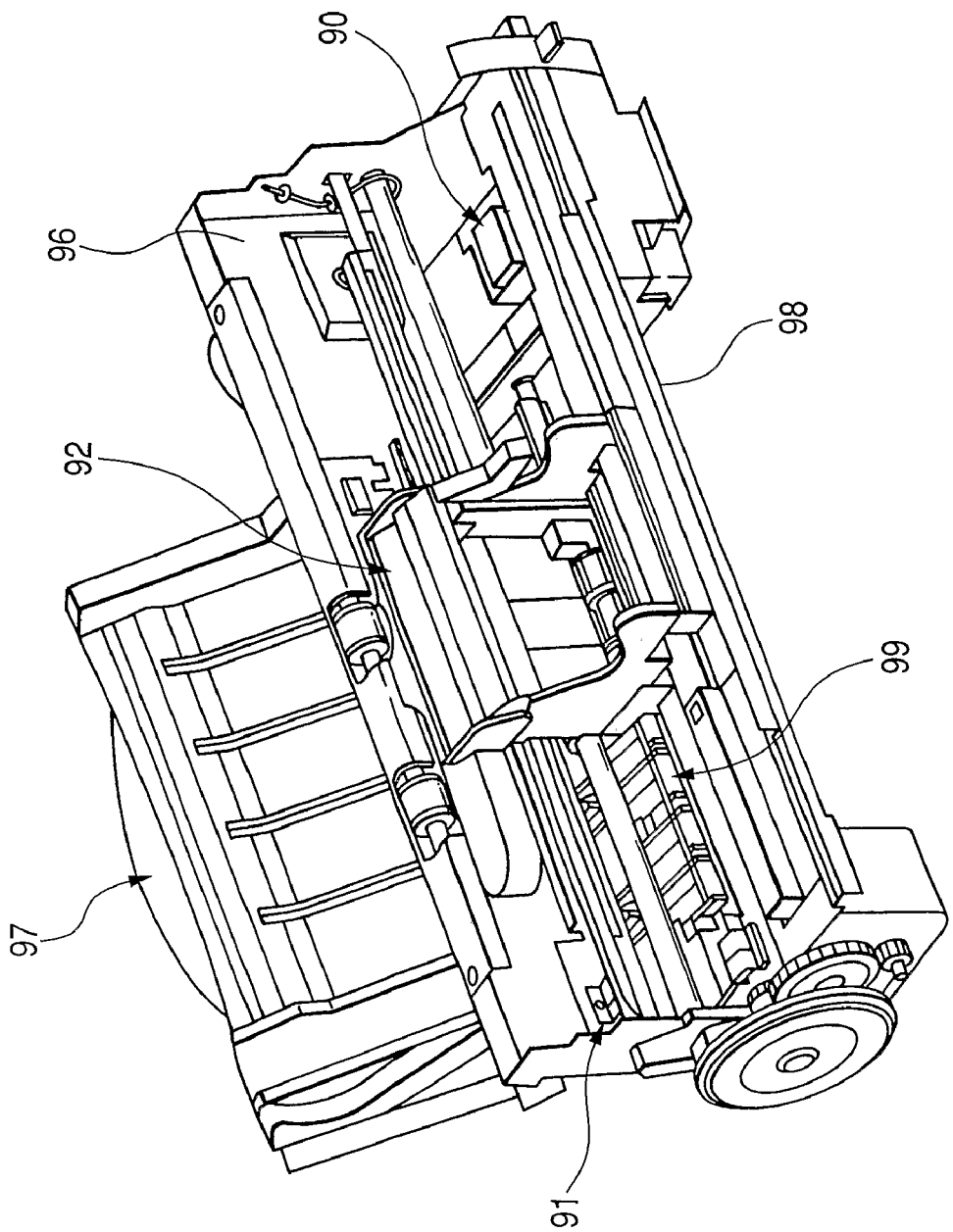
FIG. 17 is a perspective view illustrating an example of the liquid discharge apparatus.

As an example of the liquid discharge apparatus of the present invention, it can be performed to mention an ink jet recording apparatus illustrated in FIGS. 16 and 17. FIG. 17 illustrates a state that the exterior components 82 to 85, and 87 of the liquid discharge apparatus (ink jet recording apparatus) 81 illustrated in FIG. 16 are removed. The ink jet recording apparatus 81 has an automatic feeding portion 97 which performs automatic feeding of recording paper as a recording medium into an apparatus main body 96. Further, it has a transport portion 99 which introduces the recording paper sent from the automatic feeding portion 97 to a predetermined recording position, and introduces the recording paper from the recording position to a sheet discharging port 98, a recording portion 91 which performs recording on the recording paper transported in the recording position, and a recovery portion 90 which performs recovery processing to the recording portion 91. The recording portion 91 includes a carriage 92 which includes the liquid discharge head of the present invention, and is reciprocally conveyed on a rail.

In such an ink jet recording apparatus, the carriage 92 is conveyed on the rail by an electric signal sent out from a computer, and when a drive voltage is applied to the electrodes which sandwich the piezoelectric substance, the piezoelectric substance is displaced. Each piezoelectric chamber is pressurized through the diaphragm 15 by this displacement of the piezoelectric substance, and ink is discharged from the discharge port 11 for printing to be performed.

The liquid discharge apparatus of the present invention can discharge the liquid at high speed uniformly, and can achieve miniaturization of the apparatus.

Although being exemplified as a printer in the above-mentioned example, the liquid discharge apparatus of the present invention can be used as an industrial liquid discharge apparatus besides an ink jet recording apparatus for a facsimile, a compound machine, a copier, or the like.

(Evaluation of Piezoelectric Property)

Figure 18:
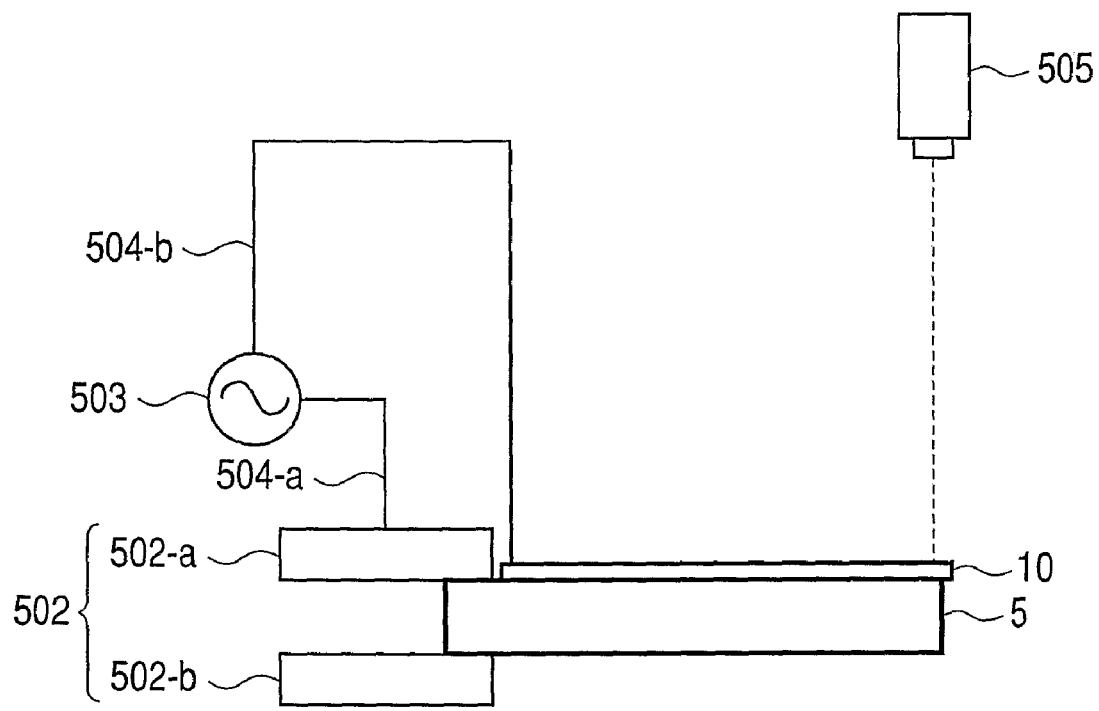
FIG. 18 is a schematic diagram illustrating an evaluation method of piezoelectric characteristics.
Figure 19:
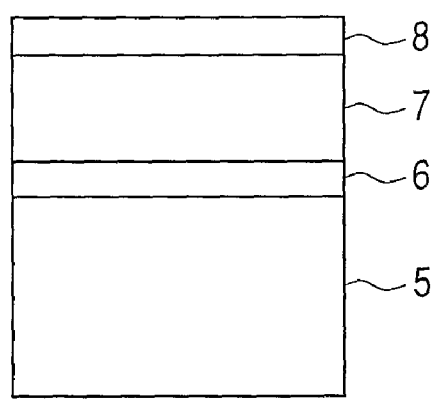
FIG. 19 is a schematic diagram illustrating an evaluation method of piezoelectric characteristics.
Figure 20:
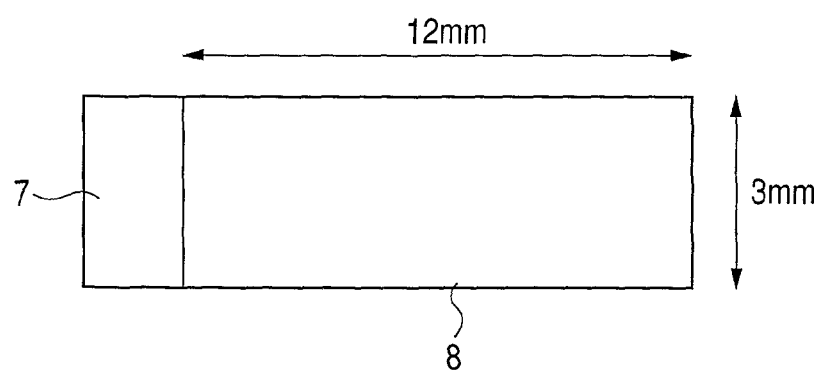
FIG. 20 is a schematic diagram illustrating an evaluation method of piezoelectric characteristics.

Evaluation of piezoelectric property of the piezoelectric film element of the present invention was performed by a $d_{31}$ measuring method which used a unimorph type cantilever system. The measuring method and a construction outline are illustrated in FIGS. 18, 19 and 20. The piezoelectric film element 10 included on the substrate 5 in order of the lower electrode film 16, the piezoelectric film 7, and the upper electrode film 18 has construction of the unimorph type cantilever one side of which was fixed by a clamp jig 502. An upper part 502-*a* of the clamp jig 502 is made of a conductive material, and is electrically in contact with the lower electrode film 16 of the piezoelectric film 7 to be connected with one (not shown) of output terminals of an AC power supply 503 through an electrical cable 504-*a*. Another side (not shown) of the output terminals of the AC power supply 503 is connected to the upper electrode film 18 through an electrical cable 504-*b*, which is construction that an AC voltage can be applied to the piezoelectric film 7.

The piezoelectric film element 10 is expanded and contracted by an electric field supplied by the AC power supply 503. The substrate 5 is bent with following it, and the unimorph type cantilever vertically vibrates with making a part of an end fixed by the clamp jig 502 as a fulcrum. It has construction of monitoring vibration of an end portion of the piezoelectric film element 10, which is not clamped, at this time with a laser Doppler velocimeter (LDV) 505, and being able to measure a displacement amount of the unimorph type cantilever to an input electric field is measurable. The displacement amount of unimorph type cantilever to the input voltage V at this time has relation of Formula 1 approximately. (J. G. Smith, W. Choi, "The constituent equations of piezoelectric heterogeneous bimorph", IEEE trans., Ultrason. Ferro. Freq. Control 38 (1991), 256-270.) Although physical property value terms of a lower electrode film, a upper electrode film, and other buffer layers are not included into Formula 1, the physical property values of those layers, that is, film thicknesses can be disregarded when a substrate thickness hs is thin enough to those thicknesses, and hence, Formula 1 is a practically sufficient approximate expression.

Formula 1

$$\delta = 3 d_{31} S_{11}{}^s S_{11}{}^P h^s (h^s + h^P) L^2 V / K \qquad \text{Formula 1-1}$$

$$K = (S_{11}{}^s)^2 (h^P)^4 + 4 S_{11}{}^s S_{11}{}^P h^s (h^P)^3 + \\ 6 S_{11}{}^s S_{11}{}^P (h^s)^2 (h^P)^2 + 4 S_{11}{}^s S_{11}{}^P (h^s)^3 h^P + \\ (S_{11}{}^P)^2 (h^s)^4 \qquad \text{Formula 1-2}$$

δ: Displacement amount of cantilever tip
V: Input voltage
L: Cantilever length
$S_{11}{}^s$: Substrate compliance (11 components)
$S_{11}{}^P$: Piezoelectric substance compliance (11 components)
$h^s$: Substrate thickness
$h^P$: Piezoelectric substance thickness From this Formula 1, $d_{31}$ of the piezoelectric film element can be determined by measuring the displacement amount to the input electric field of the unimorph type cantilever.

Embodiments

Hereafter, the piezoelectric element of the present invention and the liquid discharge head using this, and its production method will be described with citing examples.

Example 1

Production sequence of a piezoelectric thin-film element of a first example is as follows.

After performing hydrofluoric acid processing of a Si {100} substrate surface, a 100-nm-thick Y-doped $ZrO_2$ film was formed at a substrate temperature of 800° C. by the sputtering method, and then, a 60-nm-thick $CeO_2$ film was formed at a substrate temperature of 800° C. Both were single crystal films with <100> orientation. Further, a 100-nm-thick $LaNiO_3$ (LNO) film was formed on this at a substrate temperature of 850° C. as a lower electrode film by the sputtering method. Furthermore, a 200-nm-thick $SrRuO_3$ (SRO) film was formed at a substrate temperature of 600° C. on this LNO film, and the substrate which had a lower electrode film and the like was obtained. The electrode film and SRO film were single crystal films of <100> orientation.

PMN-PT with 3.3 μm of film thickness was formed as a film as a piezoelectric film on the above-mentioned lower electrode/buffer layer/substrate by an RF sputtering method of a system as illustrated in FIG. 6 with keeping a substrate temperature of 650° C. An element ratio {Mg/(Mg+Nb)}$_{Target}$ of Mg, Nb, and Ti of targets was made 0.33, and {Ti/(Mg+Nb+Ti)}$_{Target}$ was made 0.42. Sputtering was performed under the conditions of sputtering gas: $Ar/O_2=20/1$, sputtering power: 9.2 W/cm², and sputtering gas pressure: 1.8 Pa.

In consequence of a composition analysis (ICP composition analysis) by an inductively coupled plasma atomic emission analysis apparatus, as for element ratios of PMN-PT of the piezoelectric film, {Mg/(Mg+Nb)} was 0.33, and {Ti/

(Mg+Nb+Ti)} was 0.40. In addition, according to 2θ/θ measurement of X-ray diffraction, only reflection peaks resulting from {00L} planes (L=1, 2, 3, ..., n: n is an integer) of the perovskite structure of PMN-PT were detected. In addition, when positive pole measurement of an asymmetric plane {202} was performed, reflection peaks appeared in quarter symmetry. Consequently, it was confirmed that the piezoelectric film was a single crystal film with the PMN-PT perovskite type structure of <100> orientation. Similarly, by reciprocal lattice mapping of {004} and {204} by the X-ray diffraction at a temperature of 300K, it was confirmed that PMN-PT was in a mixed phase of tetragonal and pueudo cubic, and, as for the tetragonal, an a-domain and a c-domain existed. Furthermore, it turned out that the a-domain and c-domain had mirror image relation of a twin crystal whose twin planes were {110}. Further, a 4-nm-thick Ti film and a 150-nm-thick Pt film were formed by the sputtering method in this order on the piezoelectric film as an electrode film for the piezoelectric thin-film element of the first example to be produced.

Example 2

Production sequence of a piezoelectric thin-film element of a second example is as follows.

After performing hydrofluoric acid processing of a Si {100} substrate surface, a 100-nm-thick Y-doped $ZrO_2$ film was formed at a substrate temperature of 800° C. by the sputtering method, and then, a 60-nm-thick $CeO_2$ film was formed at a substrate temperature of 800° C. Both were single crystal films of <100> orientation. Further, a 100-nm-thick $LaNiO_3$ (LNO) film was formed on this at a substrate temperature of 850° C. as a lower electrode film by the sputtering method. Furthermore, a 200-nm-thick $SrRuO_3$ (SRO) film was formed at a substrate temperature of 600° C. on this LNO film, and the substrate which had a lower electrode film and the like was obtained. The electrode film and SRO film were single crystal films of <100> orientation.

Lead scandium niobate-lead titanate with 4.2 μm of film thickness was formed as a film as a piezoelectric film on the above-mentioned lower electrode/buffer layer/substrate by the RF sputtering method of a system as illustrated in FIG. 6 with keeping a substrate temperature of 650° C. An element ratio {Sc/(Mg+Nb)}$_{Target}$ of SC, Nb, and Ti of targets was made 0.33, and {Ti/(Sc+Nb+Ti)} Target was made 0.39. Sputtering was performed under the conditions of sputtering gas: $Ar/O_2$=20/1, sputtering power: 9.2 W/cm², and sputtering gas pressure: 1.8 Pa.

In consequence of a composition analysis (ICP composition analysis) by an inductively coupled plasma atomic emission analysis apparatus, as for elemental ratios of lead scandium niobate-lead titanate of the piezoelectric film, {Sc/(Sc+Nb)} was 0.50, and {Ti/(Sc+Nb+Ti)} was 0.46. In addition, according to 2θ/θ measurement of X-ray diffraction, only reflection peaks resulting from {00L} planes (L=1, 2, 3, ..., n: n is an integer) of the perovskite structure of PMN-PT were detected. In addition, when positive pole measurement of an asymmetric plane {202} was performed, reflection peaks appeared in quarter symmetry. Consequently, it was confirmed that the piezoelectric film was a single crystal film with the lead scandium niobate-lead titanate perovskite type structure of <100> orientation. Similarly, by reciprocal lattice mapping of {004} and {204} by the X-ray diffraction at a temperature of 300K, it was confirmed that lead scandium niobate-lead titanate was in a mixed phase of tetragonal and rhombohedral, and, as for the tetragonal, an a-domain and a c-domain existed. Furthermore, it turned out that the a-domain and c-domain had mirror image relation of a twin crystal whose twin planes were {110}. Further, a 4-nm-thick Ti film and a 150-nm-thick Pt film were formed by the sputtering method in this order on the piezoelectric film as an electrode film for the piezoelectric thin-film element of the second example to be produced.

Example 3

After performing hydrofluoric acid processing of a Si {100} substrate surface, a 100-nm-thick Y-doped $ZrO_2$ film was formed at a substrate temperature of 800° C. by the sputtering method, and then, a 60-nm-thick $CeO_2$ film was formed at a substrate temperature of 800° C. Both were single crystal films of <100> orientation. Further, a 100-nm-thick $LaNiO_3$ (LNO) film was formed on this at a substrate temperature of 850° C. as a lower electrode film by the sputtering method. Furthermore, a 200-nm-thick $SrRuO_3$ (SRO) film was formed at a substrate temperature of 600° C. on this LNO film, and the substrate which had a lower electrode film and the like was obtained. The electrode film and SRO film were single crystal films of <100> orientation.

Lead zinc niobate-lead titanate of a piezoelectric film was formed as a film on the above-mentioned lower electrode/buffer layer/substrate using the pulsed MOCVD method for performing material feeding intermittently. A film formation method is illustrated in detail below.

The following respective materials were used as starting materials. $Pb(thd)_2$: Bis (hexamethylacetyl acetylacetonate) Pb. $Zn(C_5H_7H_2)_2$: Bis(acetyl acetylacetonate)Zn. $NbC_3H_7(C_2H_5)_4$: Propyltetraethylniobium. $Ti(C_3H_7O)_4$: Tetraisopropoxy titanium.

These respective materials were heated, and mixed gases with a nitrogen gas used as an inactive carrier gas were formed respectively. As for mole ratios of respective material gas in supply routes of the mixed gases of the inactive carrier gas and starting materials, it was adjusted so that an element ratio {Zn/(Zn+Nb)} of Zn, Nb, and Ti of the material gases might become 0.33 and {Ti/(Mg+Nb+Ti)} might become 0.12. An oxygen raw material was excessively supplied to a film composition after film formation.

Figure 21:
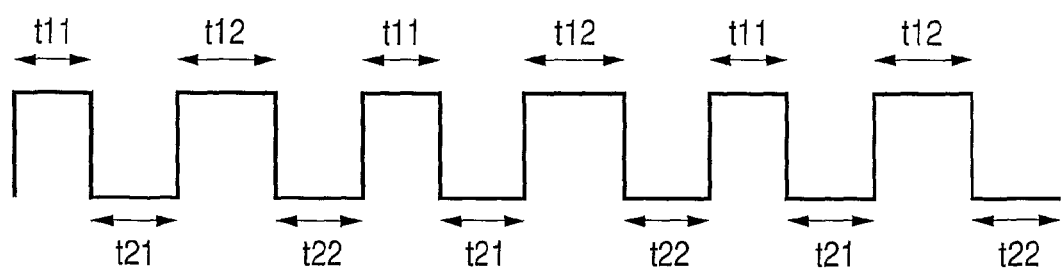
FIG. 21 is a schematic diagram illustrating sequence of material feeding time in pulsed MOCVD film formation of the present invention.

Synthesis and film formation by the pulsed MOCVD method is performed by setting by turns time t1 of film formation by spraying a mixed gas of a mixed gas of the inactive carrier gas and starting materials, and the oxygen gas from a nozzle to the substrate for film formation, and time t2 of stopping supply of the mixed gas of the inactive carrier gas and starting materials. In this embodiment, regarding the time t1 and t2 of film formation by spraying the mixed gas of the mixed gas of the inactive carrier gas and starting materials, and the oxygen gas from a nozzle to the substrate for film formation, two levels t11, t12, and t21, t22 are set respectively, and time sequence illustrated in FIG. 21 was adopted. Respective time was set at t11=12 [sec], t12=25 [sec], t21=13 [sec], and t22=18 [sec]. In the time t11 and t12 when material feeding was performed, reactive chamber pressure is 12.0 [torr], partial pressure of $O_2$ at that time was set at 8.0 [torr], film formation time was adjusted with keeping substrate temperature at 670° C., and film formation was performed so that a film thickness may become 2.5 μm.

In consequence of a composition analysis (ICP composition analysis) by an inductively coupled plasma atomic emission analysis apparatus, as for element ratios of lead zinc niobate-lead titanate of the piezoelectric film, {Zn/(Mg+Nb)} was 0.33, and {Ti/(Zn+Nb+Ti)} was 0.13. In addition, according to 2θ/θ measurement of X-ray diffraction, only reflection peaks resulting from {00L} planes (L=1, 2, 3, ..., n: n is an integer) of the perovskite structure of lead zinc niobate-lead titanate were detected. In addition, when positive pole measurement of an asymmetric plane {202} was performed, reflection peaks appeared in quarter symmetry. Consequently, it was confirmed that the piezoelectric film was a single crystal film with the lead zinc niobate-lead titanate perovskite type structure of <100> orientation. Similarly, by reciprocal lattice mapping of {004} and {204} by the X-ray diffraction at a temperature of 300K, it was confirmed that lead zinc niobate-lead titanate was in a mixed phase of tetragonal and rhombohedral, and, as for the tetragonal, an a-domain and a c-domain existed. Furthermore, it turned out that the a-domain and c-domain had mirror image relation of a twin crystal whose twin planes were {110}. Further, a 4-nm-thick Ti film and a 150-nm-thick Pt film were formed by the sputtering method in this order on the piezoelectric film as an electrode film for the piezoelectric thin-film element of the third example to be produced.

Comparative Example 1

Production sequence of a piezoelectric thin-film element of a first comparative example is as follows.

After performing hydrofluoric acid processing of a Si {100} substrate surface, a 100-nm-thick Y-doped $ZrO_2$ film was formed at a substrate temperature of 800° C. by the sputtering method, and then, a 60-nm-thick $CeO_2$ film was formed at a substrate temperature of 800° C. Both were single crystal films of <100> orientation. Further, a 100-nm-thick $LaNiO_3$ (LNO) film was formed on this at a substrate temperature of 850° C. as a lower electrode film by the sputtering method. Furthermore, a 200-nm-thick $SrRuO_3$ (SRO) film was formed at a substrate temperature of 600° C. on this LNO film, and the substrate which had a lower electrode film and the like was obtained. The electrode film and SRO film were single crystal films of <100> orientation.

PMN-PT with 3.0 μm of film thickness was formed as a film as a piezoelectric film on the above-mentioned lower electrode/buffer layer/substrate by a normal RF sputtering method with keeping a substrate temperature of 600° C. An element ratio $\{Mg/(Mg+Nb)\}_{Target}$ of Mgr Nb, and Ti of targets was made 0.33, and $\{Ti/(Mg+Nb+Ti)\}_{Target}$ was made 0.25. Sputtering was performed under the conditions of sputtering gas: $Ar/O_2=20/1$, sputtering power: 8.5 W/cm², and sputtering gas pressure: 1.0 Pa.

In consequence of a composition analysis (ICP composition analysis) by an inductively coupled plasma atomic emission analysis apparatus, as for element ratios of PMN-PT of the piezoelectric film, {Mg/(Mg+Nb)} was 0.33, and {Ti/(Mg+Nb+Ti)} was 0.23. In addition, according to 2θ/θ measurement of X-ray diffraction, only reflection peaks resulting from {00L} planes (L=1, 2, 3, . . . , n: n is an integer) of the perovskite structure of PMN-PT were detected. In addition, when positive pole measurement of an asymmetric plane {202} was performed, reflection peaks appeared in quarter symmetry. Consequently, it was confirmed that the piezoelectric film was a single crystal film with the PMN-PT perovskite type structure of <100> orientation. Similarly, by reciprocal lattice mapping of {004} and {204} by the X-ray diffraction at a temperature of 300K, it was confirmed that PMN-PT was in rhombohedral. Further, a 4-nm-thick Ti film and a 150-nm-thick Pt film were formed by the sputtering method in this order on the piezoelectric film as an electrode film for the piezoelectric thin-film element of the first comparative example to be produced.

Comparative Example 2

Production sequence of a piezoelectric thin-film element of a second comparison example is as follows.

PMN-PT with 3.0 μm of film thickness was formed as a film as a piezoelectric film on an La-doped $SrTiO_3$ {100} substrate acting for the lower electrode by the normal RF sputtering method with keeping a substrate temperature of 600° C. An element ratio $\{Mg/(Mg+Nb)\}_{Target}$ of Mgr Nb, and Ti of targets was made 0.33, and $\{Ti/(Mg+Nb+Ti)\}_{Target}$ was made 0.36. Sputtering was performed under the conditions of sputtering gas: $Ar/O_2=20/1$, sputtering power: 8.5 W/cm², and sputtering gas pressure: 1.0 Pa.

In consequence of a composition analysis (ICP composition analysis) by an inductively coupled plasma atomic emission analysis apparatus, as for element ratios of PMN-PT of the piezoelectric film, {Mg/(Mg+Nb)} was 0.33, and {Ti/(Mg+Nb+Ti)} was 0.35. In addition, according to 2θ/θ measurement of X-ray diffraction, only reflection peaks resulting from {00L} planes (L=1, 2, 3, . . . , n: n is an integer) of the perovskite structure of PMN-PT were detected. In addition, when positive pole measurement of an asymmetric plane {202} was performed, reflection peaks appeared in quarter symmetry. Consequently, it was confirmed that the piezoelectric film was a single crystal film with the PMN-PT perovskite type structure of <100> orientation. Similarly, by reciprocal lattice mapping of {004} and {204} by the X-ray diffraction at a temperature of 300K, it was confirmed that PMN-PT was in tetragonal. Nevertheless, an a-domain was not confirmed although a c-domain of the tetragonal was confirmed. Further, a 4-nm-thick Ti film and a 150-nm-thick Pt film were formed by the sputtering method in this order on the piezoelectric film as an electrode film for the piezoelectric thin-film element of the second comparative example to be produced.

Table 1 shows measurement results of piezoelectric constants of the piezoelectric thin-film elements of the first, second, and third examples, and the first and second comparative examples. Evaluation of piezoelectric constants was performed by the $d_{31}$ measuring method which used a unimorph type cantilever system. Samples for the d31 measurement were produced by cutting the top electrodes 8 of the piezoelectric thin-film elements into shapes illustrated in FIG. 15-3 by a dicer after working them into 12 mm×3 mm rectangle patterns. At this time, as for the top electrodes 8, in the piezoelectric thin-film elements on Si {100} substrates of the first, second, and third examples, and 3, and the first comparative example, such arrangement that each side of the rectangles may become parallel to a <100> direction of the Si {100} substrates was adopted. In addition, in the piezoelectric thin-film elements on the La-doped $SrTiO_3$ {100} substrate of the second comparative example, such arrangement that each side of the rectangles may become parallel to a <100> direction of the $SrTiO_3$ {100} substrate was adopted.

In the determination of d31 of this example, a 500-Hz sine wave was given as an input signal voltage to the sample so that an electric field (a voltage of 0 to 45 V is applied per piezoelectric substance film thickness of 3 μm) of 0 to 150 [kV/cm] might be applied to the piezoelectric thin-film element 10. By measuring a displacement amount delta at a tip of the cantilever to the input signal voltage under this condition, d31 was determined. As for polarity of the voltage, the polarity which made a displacement maximum in the same electric field was selected. A reason why the sine wave was adopted as input signal voltage is because the displacement delta at the tip of the cantilever eliminated an inertia term of a vibrational motion since mass of the cantilever was large.

Physical property values used in Formula 1 are as follows. $S11^s=7.7\times10^{-12}$ [m²/N], and $S11^P=59.5\times10^{-12}$ [m²/N] were used in the first, second, and third examples, and the first comparative example, and $S11^s=3.8\times10^{-12}$ [m²/N], and $S11^P=59.5\times10^{-12}$ [m²/N] were used in the second comparative example.

TABLE 1

|  | Ex. 1 | Ex. 2 | Ex. 3 | Com. Ex. 1 | Com. Ex. 2 |
|---|---|---|---|---|---|
| Piezoelectric constant (pC/N) | −820 | −920 | −840 | −350 | −490 |

As shown in Table 1, the piezoelectric thin-film elements in the first to fifth examples achieved high piezoelectricity also in thin films.

Example 4

Next, liquid discharge heads in the first example and the first comparative example were produced in the following procedure.

Similarly to the first example except using an SOI substrate on which a 500-nm-thick epitaxial Si film and a 500-nm-thick SiO₂ layer were formed, a piezoelectric thin-film element was produced. After patterning an actuator section of this piezoelectric thin-film element, a diaphragm and an individual liquid chamber were formed by dry etching of the Si substrate of a handle layer by an inductively coupled plasma method (ICP method). Next, another Si substrate on which a common liquid chamber and a communication hole were formed was bonded to this, and the substrate on which a discharge port was further formed was bonded to the above-mentioned Si substrate on which a common liquid chamber and a communication hole were formed. In this way, the liquid discharge head where the diaphragm includes an $SiO_x$ layer, a Si film, a $ZrO_2$ film in which Y was doped, and a $CeO_2$ film was produced. Furthermore, the liquid discharge head whose piezoelectric thin-film element was produced similarly to the fourth example was made a liquid discharge head of the sixth example, and the liquid discharge head whose piezoelectric thin-film element was produced similarly to the second comparative example was made a liquid discharge head of the fourth comparative example. A drive signal was applied to and drove these liquid discharge heads, a φ20 μm laser beam was radiated on a center portion of the individual liquid chamber of the liquid discharge head from an upper electrode side, and a displacement amount of the liquid discharge head was evaluated by a laser Doppler displacement system. In consequence, a displacement of the liquid discharge head in the fourth example was 0.32 μm, that is, large.

This application claims the benefit of Japanese Patent Application No. 2006-196114, filed Jul. 18, 2006, which is hereby incorporated by reference herein in its entirety.

The invention claimed is:

1. A piezoelectric substance which is made of oxide with perovskite type structure of $ABO_3$, where a principal component of A is Pb, and principal components of B contain at least two kinds of elements among Nb, Mg, Zn, Sc, Cd, Ni, Mn, Co, Yb, In, and Fe, and Ti, and is a uniaxial orientation crystal or a single crystal which has an a-domain and a c-domain of tetragonal, wherein the oxide is expressed in $(Pb_k,\alpha_l)_x(Mg_m, Nb_n, Ti_O, \beta_p)_yO_3$ (where, $1\leq x/y<1.5$, $k+l=1$, $0.7\leq k\leq1$, $0\leq l\leq0.3$, $m+n+o+p=1$, $0.1<m<0.3$, $0.3<n<0.5$, $0.2<o<0.4$, and $0\leq p<0.3$ are fulfilled, α contains any one kind of element selected from among La, Ca, Ba, Sr, Bi, and Sb, and β contains any one kind of element selected from among Pb, Sc, In, Yb, Ni, Ta, Co, W, Fe, and Sn).

2. The piezoelectric substance according to claim 1, wherein
the crystal phase has any one of pseudo cubic, rhombohedral, and monoclinic, and tetragonal.

3. A piezoelectric substance which is made of oxide with perovskite type structure of $ABO_3$, where a principal component of A is Pb, and principal components of B contain at least two kinds of elements among Nb, Mg, Zn, Sc, Cd, Ni, Mn, Co, Yb, In, and Fe, and Ti, and is a uniaxial orientation crystal or a single crystal which has an a-domain and a c-domain of tetragonal, wherein the oxide is expressed in $(Pb_k,\alpha_l)_x(Sc_m, Nb_n, Ti_O, \beta_p)_yO_3$ (where, $1\leq x/y<1.5$, $k+l=1$, $0.7\leq k\leq1$, $0\leq l\leq0.3$, $m+n+o+p=1$, $0.1<m<0.4$, $0.1<n<0.4$, $0.3<o<0.5$, and $0\leq p<0.3$ are fulfilled, α contains any one kind of element selected from among La, Ca, Ba, Sr, Bi, and Sb, and β contains any one kind of element selected from among Pb, Ta, In, Yb, Mg, Ni, Co, W, Fe, and Sn).

4. A piezoelectric substance which is made of oxide with perovskite type structure of $ABO_3$, where a principal component of A is Pb, and principal components of B contain at least two kinds of elements among Nb, Mg, Zn, Sc, Cd, Ni, Mn, Co, Yb, In, and Fe, and Ti, and is a uniaxial orientation crystal or a single crystal which has an a-domain and a c-domain of tetragonal, wherein the oxide is expressed in $(Pb_k,\alpha_l)_x(Zn_m, Nb_n, Ti_O, \beta_p)_yO_3$ (where, $1\leq x/y<1.5$, $k+l=1$, $0.7\leq k\leq1$, $0\leq l\leq0.3$, $m+n+o+p=1$, $0.2<m<0.4$, $0.5<n<0.7$, $0.05<o<0.2$, and $0\leq p<0.3$ are fulfilled, α contains any one kind of element selected from among La, Ca, Ba, Sr, Bi, and Sb, and β contains any one kind of element selected from among Pb, Sc, In, Yb, Ni, Ta, Co, W, Fe, Sn, and Mg).

5. A piezoelectric substance which is made of oxide with perovskite type structure of $ABO_3$, where a principal component of A is Pb, and principal components of B contain at least two kinds of elements among Nb, Mg, Zn, Sc, Cd, Ni, Mn, Co, Yb, In, and Fe, and Ti, and is a uniaxial orientation crystal or a single crystal which has an a-domain and a c-domain of tetragonal, wherein at least a part of the a-domain and c-domain have mirror image relation of a twin crystal, a (N0N) (N is an integer) plane of which is made a twin plane.

6. The piezoelectric substance according to claim 1, being formed as a film which has a thickness in a range of 1 μm to 10 μm (both inclusive).

7. A piezoelectric element which has a first electrode film, a piezoelectric film, and a second electrode film on a substrate, the piezoelectric film including the piezoelectric substance according to claim 6, and an electric field can be applied in a thickness direction of the piezoelectric film by the first electrode film and the second electrode film.

8. The piezoelectric element according to claim 7, wherein the piezoelectric film is in <100> orientation.

9. The piezoelectric element according to claim 7, wherein the first electrode film includes oxide with perovskite type structure which has <100> orientation.

10. The piezoelectric element according to claim 7, comprising a part which includes Si whose surface is a plane (100) as the substrate, and using the substrate which has a buffer layer on the part which includes Si.

11. A liquid discharge head which includes a discharge port which discharges a liquid, and a piezoelectric element for discharging the liquid from the discharge port, the piezoelectric element being the piezoelectric element according to claim 7.

12. A liquid discharge apparatus which has a liquid discharge head, and a mounting section on which the liquid discharge head is mounted, the liquid discharge head being the liquid discharge head according to claim 11.

13. The piezoelectric substance according to claim 3, wherein
the crystal phase has any one of pseudo cubic, rhombohedral, and monoclinic, and tetragonal.

14. The piezoelectric substance according to claim 3, being formed as a film which has a thickness in a range of 1 μm to 10 μm (both inclusive).

15. A piezoelectric element which has a first electrode film, a piezoelectric film, and a second electrode film on a substrate, the piezoelectric film including the piezoelectric substance according to claim 14, and an electric field can be applied in a thickness direction of the piezoelectric film by the first electrode film and the second electrode film.

16. The piezoelectric element according to claim 15, wherein the piezoelectric film is in <100> orientation.

17. The piezoelectric element according to claim 15, wherein the first electrode film includes oxide with perovskite type structure which has <100> orientation.

18. The piezoelectric element according to claim 15, comprising a part which includes Si whose surface is a plane (100) as the substrate, and using the substrate which has a buffer layer on the part which includes Si.

19. A liquid discharge head which includes a discharge port which discharges a liquid, and a piezoelectric element for discharging the liquid from the discharge port, the piezoelectric element being the piezoelectric element according to claim 15.

20. A liquid discharge apparatus which has a liquid discharge head, and a mounting section on which the liquid discharge head is mounted, the liquid discharge head being the liquid discharge head according to claim 19.

21. The piezoelectric substance according to claim 4, wherein
the crystal phase has any one of pseudo cubic, rhombohedral, and monoclinic, and tetragonal.

22. The piezoelectric substance according to claim 4, being formed as a film which has a thickness in a range of 1 μm to 10 μm (both inclusive).

23. A piezoelectric element which has a first electrode film, a piezoelectric film, and a second electrode film on a substrate, the piezoelectric film including the piezoelectric substance according to claim 22, and an electric field can be applied in a thickness direction of the piezoelectric film by the first electrode film and the second electrode film.

24. The piezoelectric element according to claim 23, wherein the piezoelectric film is in <100> orientation.

25. The piezoelectric element according to claim 23, wherein the first electrode film includes oxide with perovskite type structure which has <100> orientation.

26. The piezoelectric element according to claim 23, comprising a part which includes Si whose surface is a plane (100) as the substrate, and using the substrate which has a buffer layer on the part which includes Si.

27. A liquid discharge head which includes a discharge port which discharges a liquid, and a piezoelectric element for discharging the liquid from the discharge port, the piezoelectric element being the piezoelectric element according to claim 23.

28. A liquid discharge apparatus which has a liquid discharge head, and a mounting section on which the liquid discharge head is mounted, the liquid discharge head being the liquid discharge head according to claim 27.

29. The piezoelectric substance according to claim 5, wherein
the crystal phase has any one of pseudo cubic, rhombohedral, and monoclinic, and tetragonal.

30. The piezoelectric substance according to claim 5, being formed as a film which has a thickness in a range of 1 μm to 10 μm (both inclusive).

31. A piezoelectric element which has a first electrode film, a piezoelectric film, and a second electrode film on a substrate, the piezoelectric film including the piezoelectric substance according to claim 30, and an electric field can be applied in a thickness direction of the piezoelectric film by the first electrode film and the second electrode film.

32. The piezoelectric element according to claim 31, wherein the piezoelectric film is in <100> orientation.

33. The piezoelectric element according to claim 31, wherein the first electrode film includes oxide with perovskite type structure which has <100> orientation.

34. The piezoelectric element according to claim 31, comprising a part which includes Si whose surface is a plane (100) as the substrate, and using the substrate which has a buffer layer on the part which includes Si.

35. A liquid discharge head which includes a discharge port which discharges a liquid, and a piezoelectric element for discharging the liquid from the discharge port, the piezoelectric element being the piezoelectric element according to claim 31.

36. A liquid discharge apparatus which has a liquid discharge head, and a mounting section on which the liquid discharge head is mounted, the liquid discharge head being the liquid discharge head according to claim 35.

* * * * *